US010002961B2

United States Patent
Yamaji

(10) Patent No.: US 10,002,961 B2
(45) Date of Patent: Jun. 19, 2018

(54) SEMICONDUCTOR DEVICE SUPPRESSING CURRENT LEAKAGE IN A BOOTSTRAP DIODE

(71) Applicant: FUJI ELECTRIC CO., LTD., Kawasaki (JP)

(72) Inventor: Masaharu Yamaji, Kanagawa (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 178 days.

(21) Appl. No.: 14/781,244

(22) PCT Filed: Jun. 6, 2014

(86) PCT No.: PCT/JP2014/003022
§ 371 (c)(1),
(2) Date: Sep. 29, 2015

(87) PCT Pub. No.: WO2014/199608
PCT Pub. Date: Dec. 18, 2014

(65) Prior Publication Data
US 2016/0056282 A1    Feb. 25, 2016

(30) Foreign Application Priority Data
Jun. 14, 2013    (JP) .................................. 2013-125343

(51) Int. Cl.
*H01L 29/66*    (2006.01)
*H01L 29/78*    (2006.01)
(Continued)

(52) U.S. Cl.
CPC ........ *H01L 29/7818* (2013.01); *H01L 21/761* (2013.01); *H01L 21/764* (2013.01);
(Continued)

(58) Field of Classification Search
CPC ............. H01L 29/0619; H01L 2924/00; H01L 29/8611; H01L 29/404; H01L 29/0638;
(Continued)

(56) References Cited

U.S. PATENT DOCUMENTS 5,373,435 A    12/1994    Jayaraman et al.
5,412,234 A    5/1995    Schoofs et al.
(Continued)

FOREIGN PATENT DOCUMENTS

EP    1 067 599 A1    1/2001
JP    2001-144276    5/2001
(Continued)

OTHER PUBLICATIONS

Extended European Search Report dated Dec. 19, 2016 in corresponding European Patent Application No. 14811117.2.
(Continued)

*Primary Examiner* — David Chen

(57) ABSTRACT

In a semiconductor device including a bootstrap diode and a high voltage electric field transistor on a p-type semiconductor substrate, a cavity is formed in an n⁻-type buried layer of the semiconductor substrate to use the buried layer beneath the cavity as a drain drift region of the high voltage n-channel MOSFET, whereby a leakage current by holes that flows to the semiconductor substrate side in forward biasing of the bootstrap diode can be suppressed, and charging current for a bootstrap capacitor C1 can be increased, as well as increase in chip area can be suppressed.

20 Claims, 16 Drawing Sheets

(51) Int. Cl.
*H01L 21/764* (2006.01)
*H01L 27/06* (2006.01)
*H01L 29/861* (2006.01)
*H03K 17/00* (2006.01)
*H01L 29/10* (2006.01)
*H01L 27/07* (2006.01)
*H01L 27/12* (2006.01)
*H01L 21/761* (2006.01)
*H01L 29/739* (2006.01)
*H01L 29/06* (2006.01)

(52) U.S. Cl.
CPC ...... *H01L 27/0629* (2013.01); *H01L 27/0727* (2013.01); *H01L 27/1207* (2013.01); *H01L 29/1095* (2013.01); *H01L 29/78* (2013.01); *H01L 29/8611* (2013.01); *H03K 17/002* (2013.01); *H01L 29/0619* (2013.01); *H01L 29/0649* (2013.01); *H01L 29/7393* (2013.01)

(58) Field of Classification Search
CPC ............. H01L 29/0649; H01L 29/0834; H01L 29/7395; H01L 27/0248
USPC ................ 257/139, 329, 493, 495, E29.255, 257/E29.262
See application file for complete search history.

(56) References Cited

U.S. PATENT DOCUMENTS

| | | |
|---|---|---|
| 5,502,632 A | 3/1996 | Warmerdam et al. |
| 5,666,280 A | 9/1997 | Janaswamy et al. |
| 6,069,396 A | 5/2000 | Funaki |
| 6,455,391 B1 | 9/2002 | Villa et al. |
| 6,825,700 B2 | 11/2004 | Hano |
| 7,019,364 B1 | 3/2006 | Sato et al. |
| 7,235,456 B2 | 6/2007 | Sato et al. |
| 7,476,942 B2 | 1/2009 | Watanabe et al. |
| 7,507,634 B2 | 3/2009 | Sato et al. |
| 7,605,443 B2 | 10/2009 | Ogura |
| 2002/0113286 A1 | 8/2002 | Shimizu |
| 2003/0218186 A1 | 11/2003 | Hano |
| 2004/0119132 A1 | 6/2004 | Akiyama et al. |
| 2009/0243696 A1* | 10/2009 | Jeon ................ H01L 21/823481 327/333 |
| 2011/0316115 A1 | 12/2011 | Shimizu |
| 2012/0267750 A1 | 10/2012 | Imai et al. |

FOREIGN PATENT DOCUMENTS

| | | |
|---|---|---|
| JP | 2002-324848 | 11/2002 |
| JP | 2003-332540 | 11/2003 |
| JP | 2004-47937 | 2/2004 |
| JP | 2004-200472 | 7/2004 |
| JP | 3604148 | 10/2004 |
| JP | 2006-5182 | 1/2006 |
| JP | 3941206 | 4/2007 |
| JP | 2012-9694 | 1/2012 |
| JP | 5055813 | 8/2012 |
| JP | 2012-227300 | 11/2012 |

OTHER PUBLICATIONS

PCT International Preliminary Report on Patentability dated Dec. 23, 2015 in corresponding International Patent Application No. PCT/JP2014/003022.

International Search Report dated Aug. 19, 2014, in corresponding International Application No. PCT/JP2014/003022.

* cited by examiner

SEMICONDUCTOR DEVICE SUPPRESSING CURRENT LEAKAGE IN A BOOTSTRAP DIODE

CROSS-REFERENCE TO RELATED APPLICATIONS

This application is a U.S. National Stage Application, which claims the benefit under 35 U.S.C. § 371 of PCT International Patent Application No. PCT/JP2014/003022, filed Jun. 6, 2014, which claims the foreign priority benefit under 35 U.S.C. § 119 of Japanese Patent Application No. 2013-125343, filed Jun. 14, 2013, the contents of which are incorporated herein by reference.

TECHNICAL FIELD

The present invention relates to semiconductor devices such as high-voltage integrated circuit devices.

BACKGROUND ART

Power devices such as IGBTs (Insulated Gate Bipolar Transistors) and MOSFETs (Metal-Oxide-Semiconductor Field-Effect Transistors) are widely used in many fields, including motor control inverters, power supply applications for large capacity FPDs (Flat Panel Displays) and the like, and inverters for home electrical appliances such as air conditioners and lighting.

Conventionally, such power devices have been driven and controlled by an electronic circuit formed by combining semiconductor elements such as a photo coupler and electronic components such as a transformer. However, recent technological developments on LSI (Large Scale Integration) have put high-voltage integrated circuit devices with a rated voltage of up to 1200 V into practical applications.

FIG. 10 is a structural diagram of a main part that includes a power module forming a motor control inverter and a main circuit drive circuit (for example, see PTL 1). Power devices used to drive a three-phase motor 70 form a bridge circuit and are stored in the same package so as to have a structure as a power module 71.

In the FIG. 10, the power module 71 is composed of IGBTs as power devices and diodes. Alternatively, instead of the IGBTs, the power devices may be MOSFETs. In FIG. 10, the IGBTs are represented by upper arm output elements Q1 to Q3 and lower arm output elements Q4 to Q6, and the diodes are represented by D1 to D6.

A high potential-side terminal (=VCC2H terminal) of a main power supply VCC2 is connected to collectors of the Q1, the Q2, and the Q3, and a low potential-side terminal (=VCC2L terminal) thereof is connected to emitters of the Q4, the Q5, and the Q6.

A gate of each IGBT is connected to an output of a main circuit drive circuit 72, and outputs U, V, and W of the inverter formed by the power module 71 are connected to the three-phase motor 70.

The main power supply VCC2 supplies a high voltage of usually AC 100 to 400 V. Particularly, when each of the Q4, the Q5, and the Q6 is in an OFF state and each of the Q1, the Q2, and the Q3 is in an ON state, an emitter potential of each of the Q1, the Q2, and Q3 is at high voltage level.

Due to that, the gates of the elements, when driven, need to be driven at an even higher voltage than the emitter potential level.

In addition, input/output terminals I/O (Input/Output) of the main circuit drive circuit 72 are usually connected to a microcomputer that entirely controls the inverter circuit composed of the power module 71. There will be described an exemplary case in which the main circuit drive circuit 72 is composed of a high-voltage integrated circuit device.

FIG. 11 is a location diagram of a main part including each element in a case in which the main circuit drive circuit is composed of a high-voltage integrated circuit device. The main circuit drive circuit 72 transmits and receives signals to and from a microcomputer through the input/output terminals I/O. The main circuit drive circuit 72 includes a control circuit (CU: Control Unit) that generates a control signal for turning ON/OFF IGBTs. Additionally, the main circuit drive circuit 72 includes gate drive circuits (GDUs: Gate Driver Units) that receive a signal from the CU to drive the gates of the IGBTs and also detects overcurrent in the IGBTs to transmit an abnormal signal to the CU. Furthermore, the main circuit drive circuit 72 includes an LSU (level shift circuit) that serves to mediate a potential (=VCC2L) level of the VCC2L terminal and a potential (=VCC2H) level of the VCC2H terminal regarding gate signals and alarm signals of the Q1, the Q2, and the Q3 connected to the high potential-side among the IGBTs forming the bridge of FIG. 10.

The GDUs include a GDU-U, a GDU-V, and a GDU-W respectively connected to the Q1, the Q2, and the Q3 respectively and a GDU-X, a GDU-Y, and a GDU-Z respectively connected to the Q4, the Q5, and the Q6 respectively. The GDU-U, the GDU-V, and the GDU-W respectively are circuits whose U-OUT, V-OUT, and W-OUT terminals respectively are at reference potential. Next will be a description of one example of the LSU in the circuit.

FIG. 12 is a basic structure diagram of an LSU (a level shift circuit). The basic structure uses a high-voltage n-channel MOSFET 61 and a resistor RL1. The high-voltage n-channel MOSFET 61 serves to level-shift a signal S1 from a CU (a control circuit) and output it to a GDU-U, a GDU-V, and a GDU-W. In the LSU, a signal S2 to be input to an upper arm GDU is output from between the high-voltage n-channel MOSFET 61 and the resistor RL1.

The high-voltage n-channel MOSFET 61 used in the LSU is required to have a breakdown voltage of about from 600 to 1400 V equivalent to that of the IGBTs (the upper and lower arm output elements Q1 to Q6) that drive the three-phase motor 70.

Next, a description will be given of a conventional high-voltage integrated circuit device (an HV gate driver IC) in which a bootstrap system is formed on the same semiconductor substrate (see PTL 2).

FIG. 13 is a circuit structural diagram in a case in which the GDU-U that drives the upper arm output element Q1 of FIG. 10 and the GDU-X illustrated in FIG. 11, an LSU, and a bootstrap diode Db are integrated in one chip. Obviously, the GDU-V and the GDU-W have the same structure.

FIG. 14 illustrates a sectional view of a main part in a case in which the high-voltage integrated circuit device illustrated in FIG. 13 is formed on an epitaxial substrate. The diagram illustrates the GDU-U and the bootstrap diode Db illustrated in FIG. 13.

As for the LSU (the level shift circuit) described in FIG. 13, only a level shift circuit on the level up side is illustrated.

Here, operation of the bootstrap circuit will be described. A Vb voltage (voltage of C1) provides a power supply to the GDU-U. In general, the Vb voltage is set to about 15 V in order to surely enhance (full ON) the external IGBT (Q1) that the HV gate driver IC drives.

The Vb voltage is the voltage of a floating power supply, and a U-OUT voltage that has a rectangular waveform at high frequency is used as a reference potential. As illustrated in FIG. 13, the floating power supply is composed of a combination of the bootstrap diode Db and a bootstrap capacitor C1.

The bootstrap circuit operates when the gate of the low-side IGBT (Q4) is in an ON state and the U-OUT voltage drops to ground potential through the IGBT (Q4). At this time, the bootstrap capacitor C1 is charged by a VDD power supply as a low voltage power supply of 15 V through the bootstrap diode Db.

In addition, conversely, in a period of time when the gate of the high-side IGBT (Q1) is ON, the voltage of the U-OUT terminal becomes a voltage of the VCC2 terminal or a voltage higher than that due to a transitional surge current. Thus, a reverse breakdown voltage of the bootstrap diode Db is required to be set to a breakdown voltage value of about from 600 to 1400 V equivalent to the high-voltage n-channel MOSFET 61.

The bootstrap capacitor C1 used for charging here needs to have a large capacitance of 100 nF or more and thus can hardly be integrated. Due to this, it is common to use an externally-attached tantalum capacitor, ceramic capacitor, or the like.

PTL 3 suggests that the formation of a pn diode by using an SOI (Silicon on Insulator) substrate makes voltage resistance of a bootstrap diode higher and reduces hole leakage to the substrate.

In addition, PTL 4 discloses a SON (Silicon on Nothing) structure formation technique that does not cause cost increase and low reliability, in which a plurality of grooves are two-dimensionally formed in an array on a surface of a silicon substrate and then the silicon substrate is subjected to heat processing to change the plurality of grooves to a single planar cavity.

In addition, PTL 5 provides a method for manufacturing a low-cost and high-quality SON semiconductor substrate that includes a first step of implanting ion for forming a minute cavity in a desired region on a substrate and a second step of performing heat processing on the substrate with the minute cavity formed by the first step, in which the second step includes at least a high temperature heat processing step for exposing the substrate to a temperature of 1000° C. or higher. In addition, PTL 5 discloses a method that can manufacture a high performance high-voltage integrated circuit device by performing the above semiconductor substrate manufacturing method in steps of the method.

In addition, PTL 6 discloses a technique that can maintain high breakdown voltage when reverse breakdown voltage is applied and can prevent hole leakage to a substrate when charging a bootstrap capacitor, by locating a bootstrap diode in a high-voltage junction terminating region surrounding a high-side drive circuit unit and forming a cavity below an anode region and a cathode region of the diode.

In addition, PTL 7 discloses a bootstrap emulator function in which a bootstrap FET (a field-effect transistor) is located in a part of a high-voltage junction terminating region surrounding a high-side drive circuit unit and the gate of the FET is controlled at a timing when charging a bootstrap capacitor.

Additionally, PTL 8 describes a SOI lateral semiconductor device that can obtain high breakdown voltage and low switching loss even with the use of a thin buried oxide film formed by a SIMOX method. In the disclosure, a high-voltage IGBT and a MOSFET are arranged in parallel so as to vertically sandwich a buried oxide film of a partial SOI substrate formed by oxygen ion implantation.

In the structures illustrated in FIGS. 13 and 14, when the high-side (upper arm-side) IGBT (Q1) is turned OFF, the voltage of the U-OUT terminal is reduced to ground potential to charge the bootstrap capacitor C1. The bootstrap diode Db has a structure in which an n$^-$ layer as a N$_{epi}$ layer and an n$^+$ buried layer are provided on a p$^-$ substrate, and a p$^+$ diffusion is formed as an anode diffusion region.

Accordingly, in a process for charging the bootstrap capacitor C1, while electrons are supplied from the anode electrode of the bootstrap diode Db to the VDD power supply, holes are supplied to a low-potential cathode electrode.

However, in a low voltage region where the bootstrap diode Db has a forward voltage drop (VF voltage) of 2 V or less, many holes pass through the buried layer to flow to the p$^-$ substrate at the ground potential. As a result, in the period of time in which the U-OUT voltage is reduced to the ground potential to charge the bootstrap capacitor, a large leakage current (leaked current) occurs in the GND terminal of the p$^-$ substrate of the HV gate driver IC from the high potential-side terminal of the VDD power supply, thereby increasing current consumption. PTL 6 previously cited also states that, in a period of time for charging the bootstrap capacitor, holes escape from an anode region-side (VDD) as the p$^+$ region of the bootstrap diode Db to a p$^-$ substrate via an n$^+$ buried layer to become a leakage current Ileak.

This occurs for the reason that a rate of hole components flowing in a direction of the p$^-$ substrate fixed at the ground potential where potential barrier is low is larger than a rate of holes injected from the anode region-side as the p$^+$ region and taken into the cathode region-side as the n$^+$ region to, as minority carriers, recombine with electrons, with the result that the holes become a leakage current to the p$^-$ substrate.

In addition, as illustrated in PTL 6 and PTL 7, in order to locate the bootstrap diode or the bootstrap FET element in the high-voltage junction terminating region surrounding the high-side drive circuit, typically, two high voltage n-channel MOSFETs (equivalent to 61 of FIG. 12) for a setting signal and a resetting signal need to be similarly located in the high-voltage junction terminating region. This imposes restriction on a location region for each.

The reason for that is as follows. While the high-voltage n channel MOSFET as the level shift element uses, as a backgate layer, the p-type GND region surrounding the periphery thereof and, as a drain drift layer, the n$^-$ region as a withstand voltage region surrounded by the p$^-$ region, the bootstrap diode is fixed at the VDD potential illustrated in FIG. 13 and the cathode region is connected to the U-VCC terminal similarly illustrated in FIG. 13. Accordingly, the high voltage n-channel MOSFET and the bootstrap diode cannot be located close to each other, and need to be sufficiently spaced apart from each other. Alternatively, an element separation structure is additionally needed, such as trench groove formation or formation of a diffusion layer for separation in each thereof. This leads to increase in chip area of the HV gate driver IC and increase in production cost.

FIG. 15 is a planar structural diagram of a case in which both of the high-voltage n-channel MOSFET and the bootstrap diode described in PTL 6 are located in the same high-voltage junction terminating region. As for potentials of a drain layer of a level shifter (the high-voltage n-channel MOSFET) and a cathode region 7K of the bootstrap diode illustrated in FIG. 15, there is a difference between the drain potential and the VCC potential, as described above. Accordingly, in order not to allow holes to be injected from an anode region 6A of the bootstrap diode to the drain layer in charging operation of the bootstrap diode, the drain layer and the anode region 6A are located at a distance of about several hundred μm from each other. Additionally, preferably, the cathode region 7K and the drain layer are also spaced apart from each other at a distance of about several hundred μm so that, for example, in such a reverse recovery state where the drain and the cathode region 7K are raised to high voltage, electron carriers substituted in the cathode region 7K are not mistakenly injected into the drain layer of the high voltage n-channel MOSFET. This is because, since the high voltage n-channel MOSFET is the level shift element, injection of the electron carriers to the drain layer leads to malfunction of the level shift circuit.

Here, the two elements, the high voltage n-channel MOSFET and the bootstrap diode, can be located in different high-voltage junction terminating regions. However, obviously, the locations thereof occupy an extra location area, thus inevitably increasing the chip area of the HV gate driver IC.

In addition, problems caused by locating both of the high-voltage n-channel MOSFET and the bootstrap diode in the same high-voltage junction terminating region include, besides electrical separation between the elements, reduction in charging ability of the bootstrap diode. In case of a level shift circuit with a two input system, two high voltage n-channel MOSFETs are needed for a setting signal and a resetting signal. Locating these elements in the high-voltage junction terminating region imposes restriction on location areas for the anode region and the cathode region of the bootstrap diode.

In cases of applications such as inverters used in home electrical appliances or the like operated with a low rated output, a power device (here, power MOSFET) has a small gate capacitance and a carrier frequency of about 100 KHz, and a bootstrap capacitor to be charged has a capacitance of about from 100 nF to 1 μF. Thus, a charging current of the diode in charging the capacitor may be of about several ten mA. However, in cases of applications including purposes requiring high frequencies of from 500 KHz to 1 MHz or the like and inverters for industrial equipment using power devices (here, IGBTs) with large gate capacitance, the capacitance of a bootstrap capacitor to be charged is about from several μF to several ten μF. Due to this, when charging the capacitor, the diode needs to supply about several hundred mA of charging current. In addition, a forward voltage (VF) at that time is around several V that is equivalent to a discharging voltage of the capacitor. Thus, in order to supply several hundred mA level of charging current, a drift resistance of the bootstrap diode needs to be reduced and a sufficient element area needs to be secured.

CITATION LIST

Patent Literature

PTL 1: JP 3941206 B
PTL 2: U.S. Pat. No. 6,825,700 B
PTL 3: JP 2004-200472 A
PTL 4: JP 2001-144276 A
PTL 5: JP 2003-332540 A
PTL 6: JP 2012-227300 A
PTL 7: JP 3604148 B
PTL 8: JP 5055813 B

SUMMARY OF INVENTION

Technical Problem

An object of the present invention is to provide a semiconductor device that can suppress leakage current by holes that flows to a substrate side in forward biasing of a bootstrap diode, and can increase charging current for a bootstrap capacitor, as well as can suppress increase in chip area.

Solution to Problem

In order to achieve this object, according to one embodiment of the present invention, there is provided a semiconductor device including: a p-type semiconductor substrate; an n-type buried layer formed on the semiconductor substrate; an n-type semiconductor layer formed on the buried layer; a floating potential region provided in a part of the semiconductor layer; a p-type first separation region surrounding the part of the semiconductor layer where the floating potential region is provided, the first separation region being in contact with the semiconductor substrate, and spaced apart from the floating potential region to be formed in a ring-like shape; a first insulating separation region provided beneath the semiconductor layer between the floating potential region and the first separation region; a diode formed above the first insulating separation region; a p-type second separation region spaced apart from the first separation region to surround, in a ring-like shape, a region where the diode is located, and reach beneath the semiconductor layer from a surface of the semiconductor layer; an n-type source region formed in an upper part of the first separation region; and an n-type drain contact region of a transistor including the source region, the drain contact region being formed in an upper part of the semiconductor layer between a cathode region of the diode and the floating potential region.

Advantageous Effects of Invention

According to one embodiment of the present invention, it is possible to suppress leakage current by holes that flows to a substrate side in forward biasing of a bootstrap diode, and to increase charging current for a bootstrap capacitor, as well as, to suppress increase in chip area.

BRIEF DESCRIPTION OF DRAWINGS

FIGS. 2A and 2B are planar views of the main part of the high-voltage integrated circuit device according to the first embodiment of the present invention, in which FIG. 2A is a general view of gate driver circuits and a withstand voltage structure portion surrounding the gate driver circuits, and FIG. 2B is an enlarged view illustrated by enlarging a region Fa illustrated in FIG. 2A;

FIGS. 4A and 4B are planar views of a main part of another example of the high-voltage integrated circuit device according to the first embodiment of the present invention, in which FIG. 4A is a general view of gate driver circuits and a withstand voltage structure portion surrounding the gate driver circuits, and FIG. 4B is an enlarged view illustrated by enlarging a region Fb illustrated in FIG. 4A;

FIGS. 6A and 6B are diagrams illustrating a depletion layer when high voltage is applied to a cathode region and a drain contact region and flows of carriers (electrons and holes) when a high voltage n-channel MOSFET and a bootstrap diode are in ON states in FIG. 1, in which FIG. 6A is a diagram of the depletion layer and FIG. 6B is a diagram illustrating the flows of the carriers;

DESCRIPTION OF EMBODIMENTS

Hereinafter, semiconductor devices according to first to fourth embodiments of the present invention will be described with reference to the drawings.

In the present description and the accompanying drawings, "n" or "p" is put in each layer and each region, which means that electrons or holes are majority carriers. In addition, signs "+" and "−" attached to "n" and "p" mean that the semiconductor region has a relative impurity concentration higher or lower, respectively, than semiconductor regions without the signs "+" and "−".

In the descriptions and accompanying drawings of the first to the fourth embodiments given below, the same constituent elements are denoted by the same reference signs and an overlapping description is omitted.

In addition, the accompanying drawings that will be illustrated in the first to the fourth embodiments are not illustrated in exact scales and dimensional ratios in order to facilitate viewing or understanding. The present invention is not limited to the descriptions of the first to the fourth embodiments that will be given below, without departing from the scope of the invention.

In addition, in FIGS. 1, 3, and 6 to 9 of the accompanying drawings that will be illustrated in the first to the fourth embodiments, hatching that represents sections is omitted for easier viewing of the drawings.

The first to fourth embodiments below will focus on and exemplarily describe high-voltage integrated circuit devices, as typical examples of a "semiconductor device" of the present invention.

First Embodiment

Figure 1:
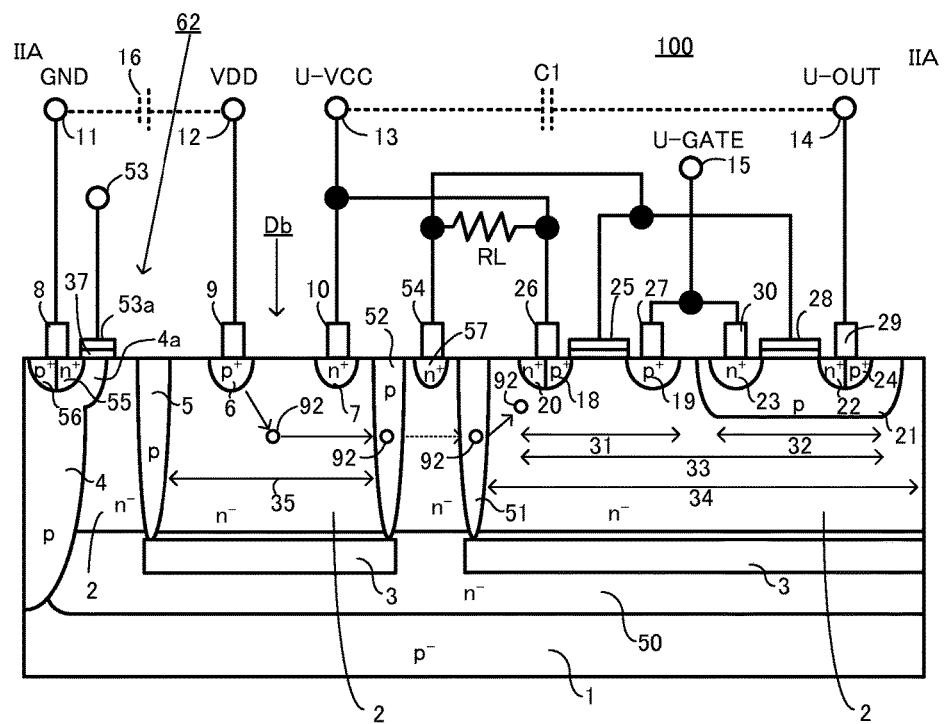
FIG. 1 is a sectional view of a main part of a high-voltage integrated circuit device according to a first embodiment of the present invention (a sectional view of a main part illustrating a sectional structure taken along a line IIA-IIA of FIG. 2B)
Figure 2A:
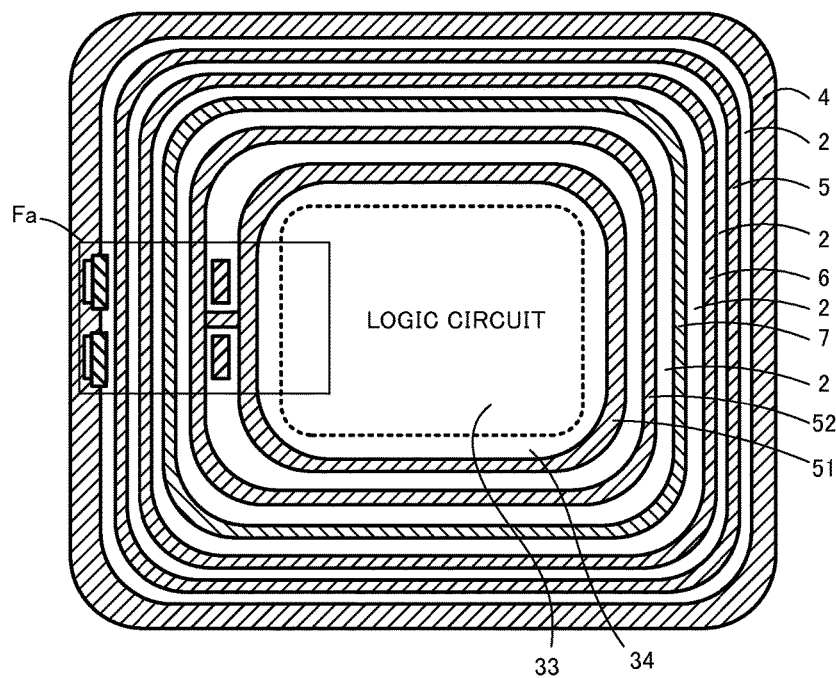
Figure 2B:
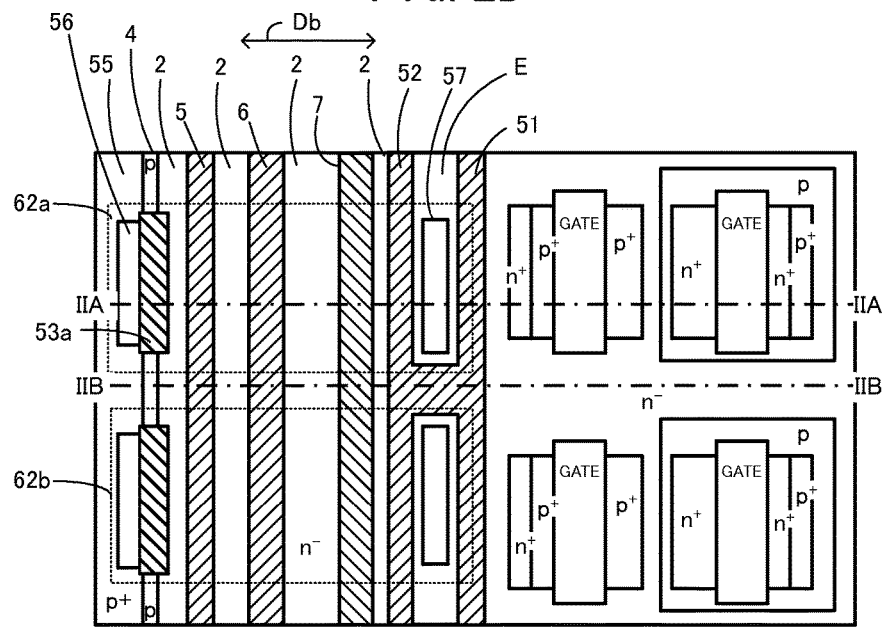
Figure 3:
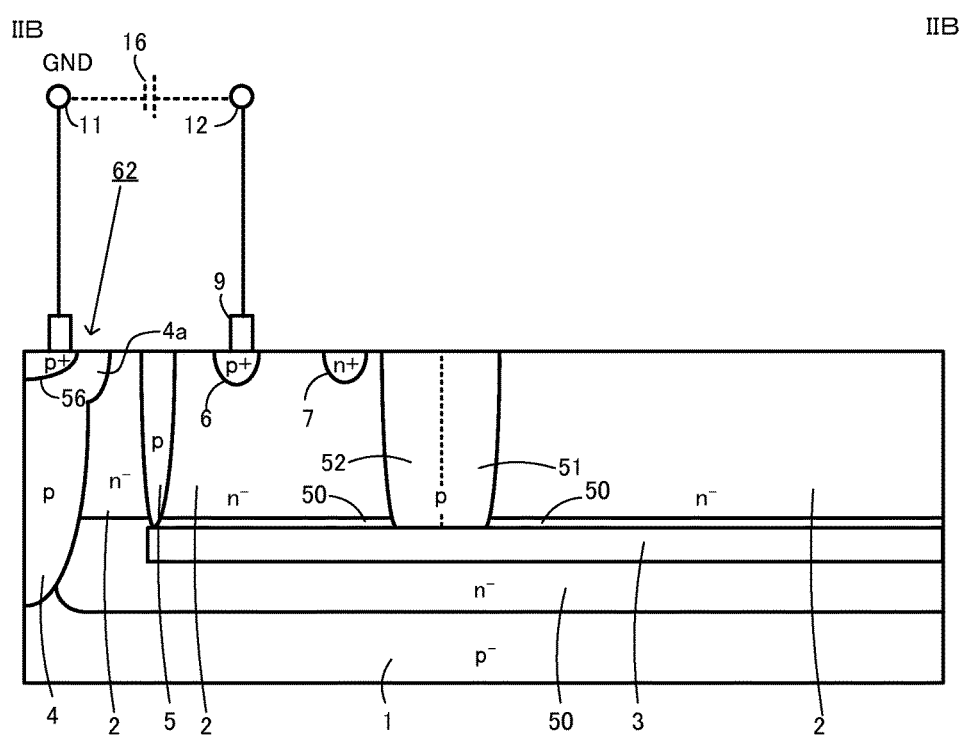
FIG. 3 is a sectional view of a main part illustrating a sectional structure taken along a line IIB-IIB of FIG. 2B.
Figure 10:
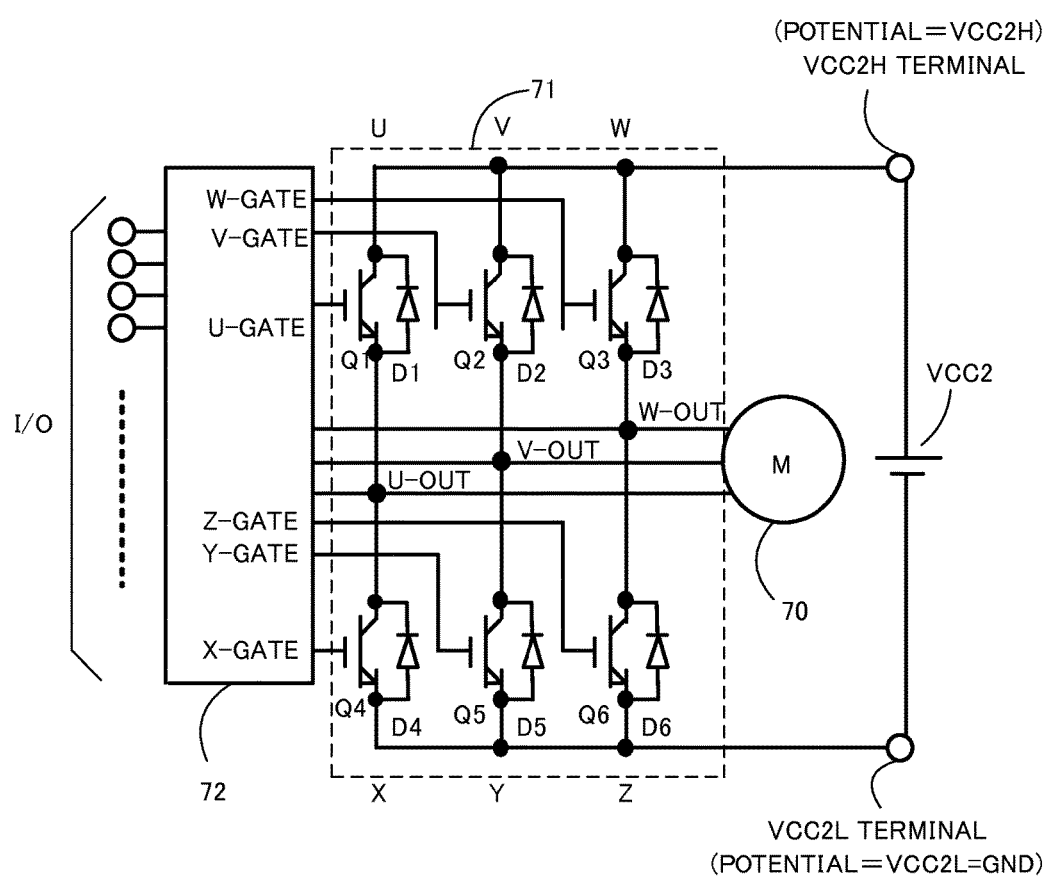
FIG. 10 is a structural diagram of a main part illustrating a power module forming a motor control inverter and a main circuit drive circuit that drives the power module.
Figure 11:
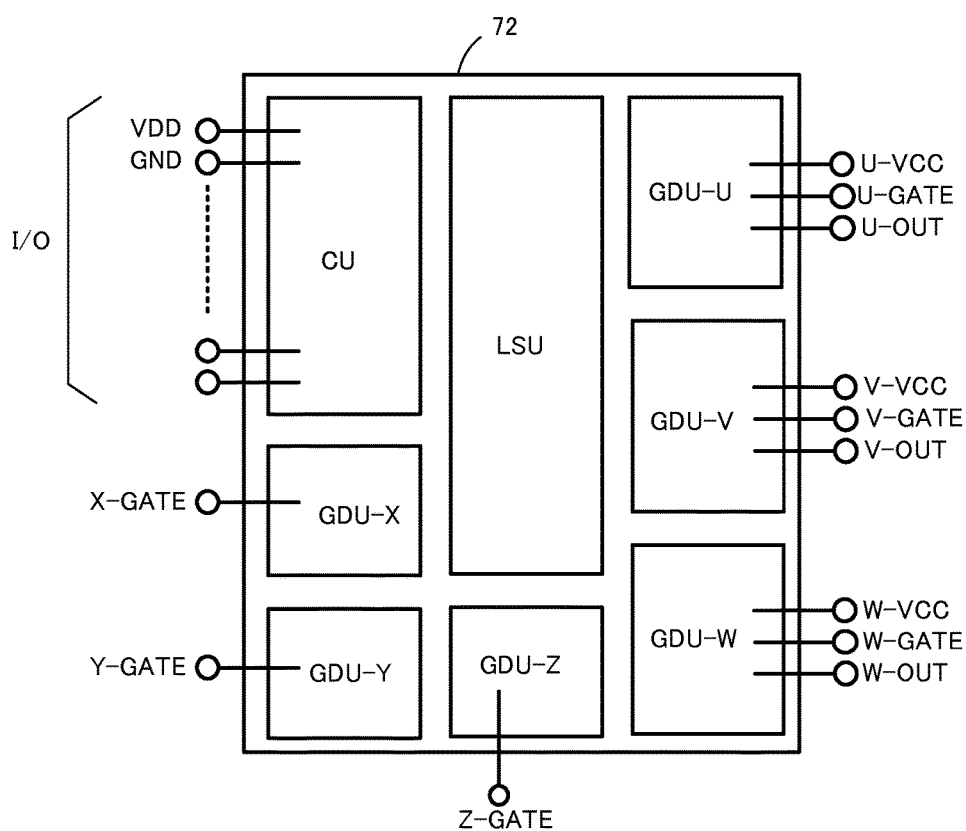
FIG. 11 is a location diagram of the main part including each element in a case in which the main circuit drive circuit of FIG. 10 is composed of a high-voltage integrated circuit device.
Figure 12:
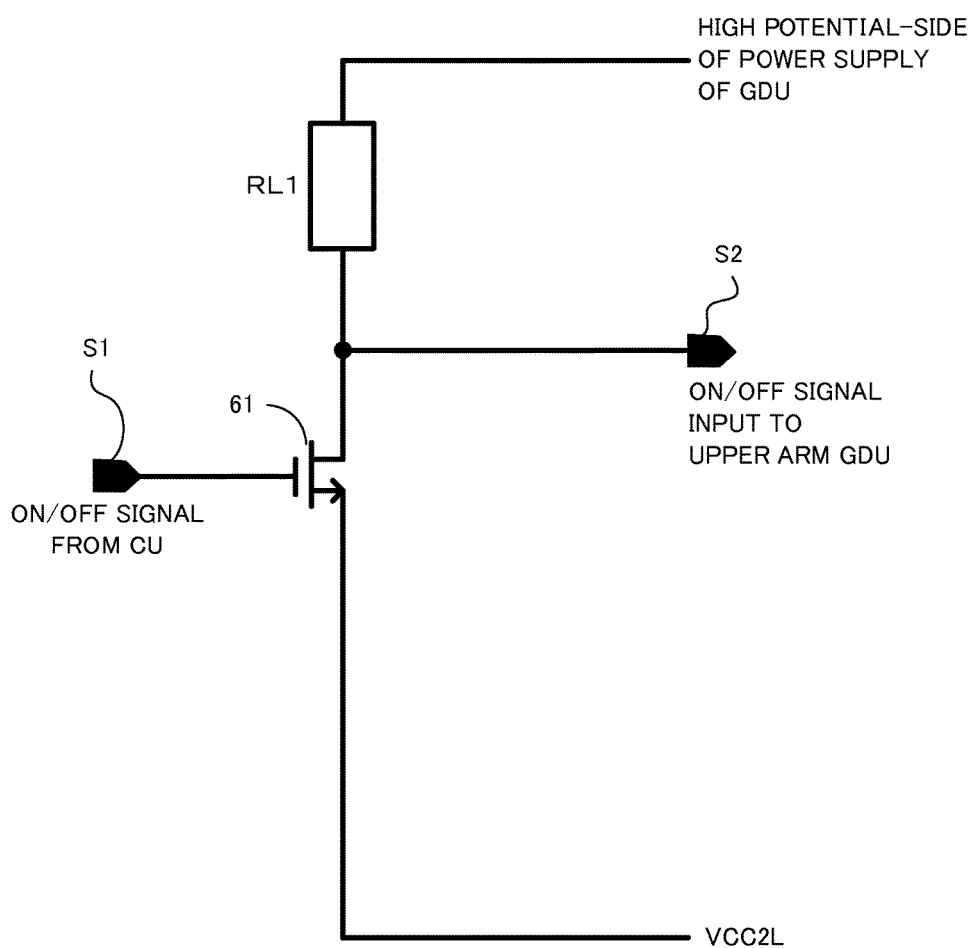
FIG. 12 is a basic structural diagram of a level shift circuit of FIG. 11.
Figure 13:
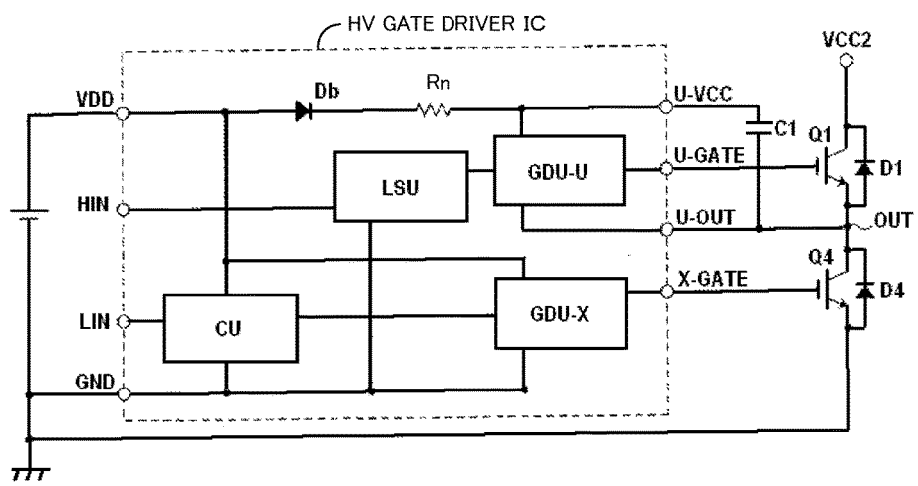
FIG. 13 is a circuit structural diagram in a case in which the gate driver circuits (the GDU-U and the GDU-V driving the upper arm IGBTs of FIG. 10) and the level shift circuit (LSU) of FIG. 11 and a bootstrap diode (Db) are integrated into one chip.
Figure 14:
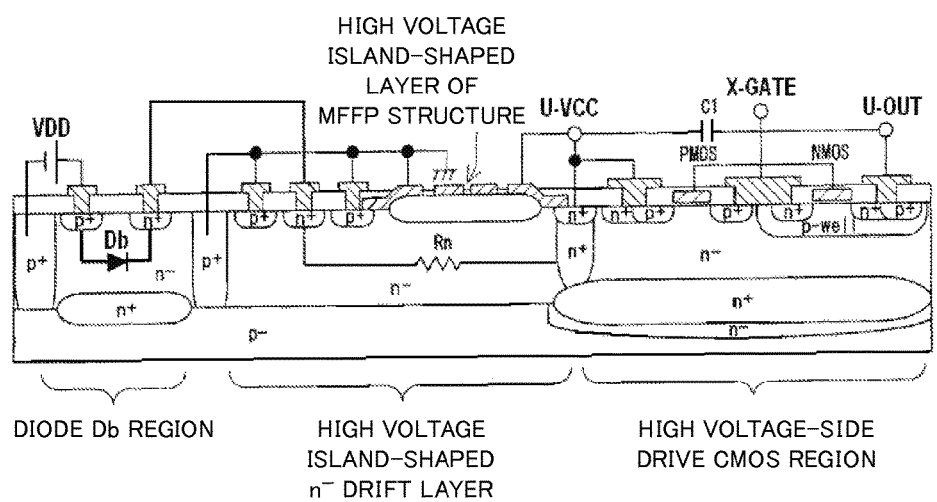
FIG. 14 is a sectional view of a main part of an HV gate driver IC in a case in which gate driver circuits and a bootstrap diode are integrated on an epitaxial substrate.
Figure 15:
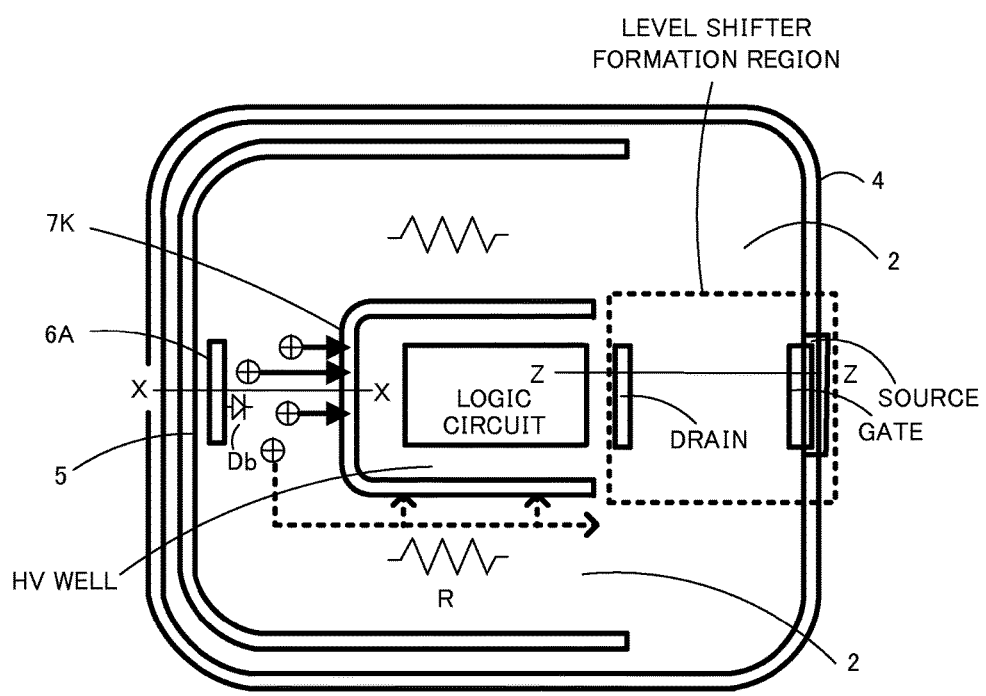
FIG. 15 is a planar structural diagram of a case in which both of a high voltage n-channel MOSFET and a bootstrap diode disclosed in PTL 6 are located in the same high voltage junction terminal region.

FIGS. 1 to 3 illustrate diagrams of parts relating to a gate driver circuit portion (GDU-U, LSU, and bootstrap diode Db) of U phase, among U phase, V phase, and W phase of a high side of a bridge circuit, for example, illustrated in FIGS. 10 and 11.

As illustrated in FIG. 1, a high-voltage integrated circuit device 100 according to a first embodiment of the present invention mainly includes a semiconductor base body where an n⁻ type epitaxial growth layer (semiconductor layer) 2 as a surface layer is formed on a surface of a p⁻ type semiconductor substrate 1 made of, for example, monocrystalline silicon. In addition, the high-voltage integrated circuit device 100 according to the first embodiment of the invention includes an n⁻ type buried layer 50 formed by diffusion at a depth of about 2 to 10 μm from the surface of the semiconductor substrate 1 or formed by epitaxial growth on the surface of the semiconductor substrate 1. In addition, the high-voltage integrated circuit device 100 according to the first embodiment of the invention includes a p-channel MOSFET 31 and a p-type offset region 21 located in an upper part of an epitaxial growth layer 2 on the buried layer 50 and an n-channel MOSFET 32 formed in the offset region 21. The p-channel MOSFET 31 and the n-channel MOSFET 32 forms a CMOS circuit 33. The CMOS circuit 33 is a logic circuit.

In addition, the high-voltage integrated circuit device 100 according to the first embodiment of the invention includes, as illustrated in FIG. 1 and FIG. 2A, an n⁺-type cathode region 7 formed in a ring-like shape so as to surround the CMOS circuit 33 in an upper part of the epitaxial growth layer 2, a p⁺-type anode region 6 spaced apart from the cathode region 7 to be formed in a ring-like shape so as to surround the cathode region 7, and a p-type floating region (a second separation region) 5 spaced apart from the anode region 6 to be formed in a ring-like shape so as to surround the anode region 6. The cathode region 7 and the anode region 6 form a bootstrap diode Db.

In addition, the high-voltage integrated circuit device 100 according to the first embodiment of the invention includes a p-type deep region (a first separation region) 4 that is spaced apart from the floating region 5 to be formed so as to surround the floating region 5 and to which GND potential is applied. In the same semiconductor substrate outside the deep region 4, circuits of other phases (V phase and W phase) can similarly be formed, as illustrated in FIG. 11. In addition, as in FIG. 11, X phase-, Y phase-, and Z-phase circuits can also be formed on the same semiconductor substrate.

Additionally, the high-voltage integrated circuit device 100 according to the first embodiment of the invention includes a cavity (a first insulating separation region) 3 of a SON structure formed so as to contact with the floating region 5 and a p-type diode separation layer (a third separation region) 52. The cavity 3 is formed by forming a large number of minute trenches from a surface of the buried layer 50 to an inside of the buried layer 50 and performing annealing processing. Accordingly, the cavity 3 is formed inside the buried layer 50. The diode separation layer 52 is surrounded by the cathode region 7.

The deep region 4 is a region for fixing a potential of the semiconductor substrate 1 to, for example, a GND potential. A p-type base region 4a is a diffusion layer selectively formed in an upper part of the epitaxial growth layer 2 and used as a backgate layer of a high voltage n-channel MOSFET 62 as a level shift device. The high voltage n-channel MOSFET 62 includes two MOSFETs, a setting MOSFET 62a and a resetting MOSFET 62b (see FIG. 2B).

On an upper part of the base region 4a are formed an $n^+$-type source region 55 and a $p^+$-type contact region 56 of the high voltage n-channel MOSFET 62. Then, above the base region 4a between the source region 55 and the epitaxial growth layer 2 is located a gate electrode 53 made of polysilicon via a gate oxide film 37 (such as $SiO_2$) as a gate insulating film. In the first embodiment, the p-type deep region 4 and the p-type base region 4a are in contact with each other, but may be formed to be spaced apart from each other. When these regions are formed to be spaced apart from each other, the $n^+$-type source region 55 is formed on the upper part of the base region 4a, and the $p^+$-type contact region 56 is formed on an upper part of each of the deep region 4 and the base region 4a.

In addition, a p-type high-side separation layer (a fourth separation region) 51 is spaced apart from the diode separation layer 52 to be formed so as to surround the CMOS circuit 33 and contact with the cavity 3 located below the CMOS circuit 33. On a surface of the epitaxial growth layer 2 (a region E) surrounded by the high-side separation layer 51 and the diode separation layer 52 is formed an $n^+$-type drain contact region 57 as a drain pickup layer of the high voltage n-channel MOSFET 62, and a drain electrode 54 is formed on the drain contact region 57. No cavity 3 is formed at a bottom portion of the epitaxial growth layer 2 surrounded by the high-side separation layer 51 and the diode separation layer 52.

One end of a level shift resistor RL is connected to the drain electrode 54 and the other end thereof is connected to a U-VCC terminal 13. The deep region 4 is connected to a GND terminal 11, and the anode region 6 is connected to a VDD terminal 12. The cathode region 7 is connected to the U-VCC terminal 13. The U-VCC terminal 13 is connected to a high potential-side of an externally-attached bootstrap capacitor C1 and furthermore connected to a $p^+$-type source region 18 of the p-channel MOSFET 31 forming the CMOS circuit 33. A lower potential-side of the bootstrap capacitor C1 is connected to an $n^+$-type source region 22 of the n-channel MOSFET 32 forming the CMOS circuit 33 and furthermore connected to a U-OUT terminal 14.

A $p^+$-type drain region 19 of the p-channel MOSFET 31 and an $n^+$-type drain region 23 of the n-channel MOSFET 32 are connected to each other, and then the connection is connected to a U-GATE terminal 15. A floating potential region 34 in which the CMOS circuit 33 is formed is connected to a high potential-side of a bootstrap power supply. The VDD terminal 12 is a high potential-side terminal of a VDD power supply (control power supply) 16 that drives a low-side circuit, and the VDD power supply 16 is a low voltage power supply that supplies several ten volts. The U-VCC terminal 13 is a high potential-side terminal of the bootstrap capacitor C1 that drives a high-side circuit. An intermediate potential of the U-OUT terminal 14 varies between a high potential-side potential VCC2H and a low potential-side potential VCC2L of a main power supply VCC2. Hereinabove, an example of U phase has been described, but the same applies to cases of V phase and W phase.

The high-side separation layer 51 and the diode separation layer 52 are partially connected to each other, as illustrated in FIGS. 2A and 2B, and formed simultaneously. Each of the deep region 4, the floating region 5, the anode region 6, the cathode region 7, the diode separation layer 52, and the high-side separation layer 51 is formed in a closed ring-like shape so that a planar shape of each thereof surrounds the floating potential region 34, as illustrated in FIG. 2A.

In the drawings, reference signs 8, 9, 10, 26, 27, 29, 30, and 54 represent electrodes connected to each layer, and reference signs 25, 28, and 53 represent gate electrodes. Additionally, reference signs 20 and 57, and 24 and 56 are contact regions. Additionally, the anode region 6 has a structure in which a $p^+$-type region that becomes a contact layer is formed in an upper part of a p-type region (not illustrated), and the cathode region 7 has a structure in which an $n^-$-type region that becomes a contact layer is formed in an upper part of an n-type region (not illustrated). In FIGS. 1 and 3, the p-type region and the n-type region are omitted.

In addition, the floating region 5, the diode separation layer 52, and the high-side separation layer 51 are floating regions whose potentials are not fixed. Additionally, the FET may be either of MOS type having a gate insulating film made of an oxide film or of MIS type having a gate insulating film made of a silicon oxide film, a silicon nitride film, or an insulating film such as a layered film thereof.

In FIGS. 1 to 3, the cavity 3 is selectively formed in an upper part of the buried layer 50. The cavity 3 is at least formed beneath (a bottom portion) the bootstrap diode Db, beneath (a bottom portion) a part between the drain contact regions 57 of the high voltage n-channel MOSFET 62, and beneath (a bottom portion) the floating potential region 34. The floating region 5, the high-side separation layer 51, and the diode separation layer 52, respectively, are formed so as to contact with the cavity 3. In a portion of the high voltage n-channel MOSFET 62, where the drain contact regions 57 is not formed, the high-side separation layer 51 and the diode separation layer 52 are connected to form a region and both thereof are at the same potential. Each of the floating region 5, the high-side separation layer 51, and the diode separation layer 52 is formed so as to reach beneath the epitaxial growth layer 2 from a surface thereof to a depth direction thereof.

Herein, the cavity 3 provided beneath the epitaxial growth layer 2 in such a manner as to cover an area below a region where the bootstrap diode Db is formed corresponds to the first insulating separation region of the present invention. Additionally, the cavity 3 provided in a lower part of the epitaxial growth layer 2 in such a manner as to cover an area below the logic circuit (the floating potential region 34) corresponds to a second insulating separation region of the invention.

The region of the epitaxial growth layer 2 having the bootstrap diode Db formed thereon has the same thickness as the floating potential region 34 having the CMOS circuit (the logic circuit) 33 formed thereon and is located in an island shape so as to surround the floating potential region 34 on the buried layer 50. The deep region 4 is provided in a ring-like shape so as to surround the region of the epitaxial growth layer 2 having the bootstrap diode Db formed thereon and is spaced apart from the floating potential region 34 to be formed so as to reach the semiconductor substrate 1 from the surface of the epitaxial growth layer 2. The floating region 5 is spaced apart from the deep region 4 to be formed in a ring-like shape so as to surround the epitaxial growth layer 2 of the part where the bootstrap diode Db is formed and reaches the cavity 3 in such a manner as to pass through from the surface of the epitaxial growth layer 2 to the cavity 3.

LOCOS is selectively formed on the surface of the epitaxial growth layer 2, and in active portions without the LOCOS are formed a GND electrode 8 connected to the deep region 4, an anode electrode 9 connected to the anode region 6, a cathode electrode 10 connected to the cathode region 7, and the like. The GND terminal 11 is connected to the GND electrode 8, the VDD terminal 12 is connected to the anode electrode 9, and the U-VCC terminal 13 is connected to the cathode electrode 10.

The high voltage n-channel MOSFET 62 and the level shift resistor RL form a level shift circuit LSU. The potential of the drain contact region 57 is a ground potential when the high voltage n-channel MOSFET 62 is ON, and the potential thereof is a potential of the U-VCC terminal 13 when it is OFF. The potential of the U-VCC terminal 13 varies in a range of from the lower potential-side potential VCC2L (=ground potential) of the main power supply VCC 2 to the high potential-side potential VCC2H thereof. In addition, the potential of the U-VCC terminal 13 becomes a potential obtained by adding a voltage (a fixed voltage) of the VDD power supply 16 to a potential of the U-OUT terminal 14.

Figure 4A:
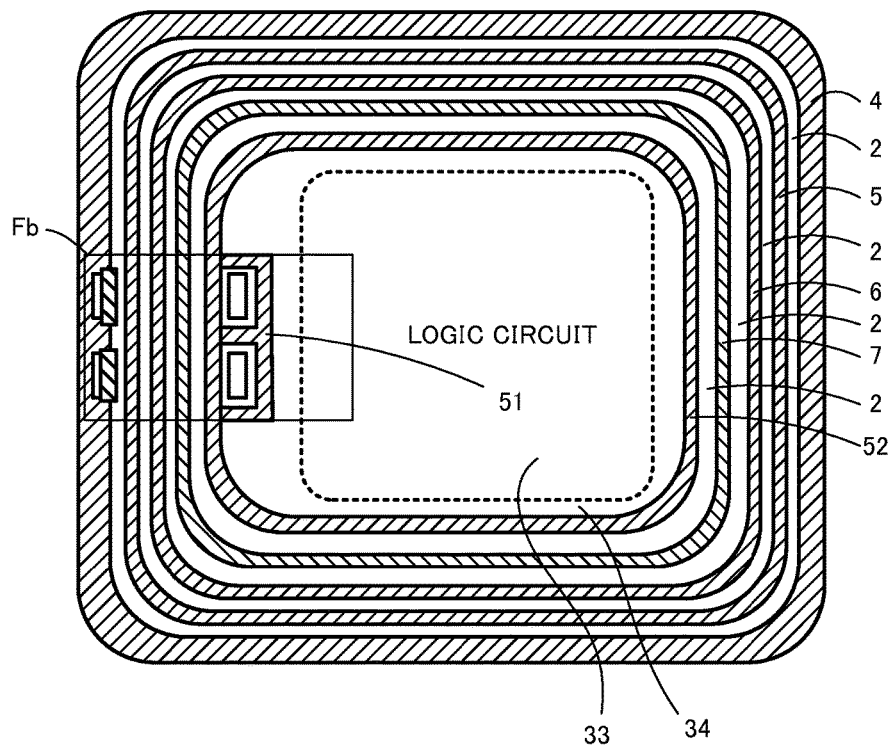
Figure 4B:
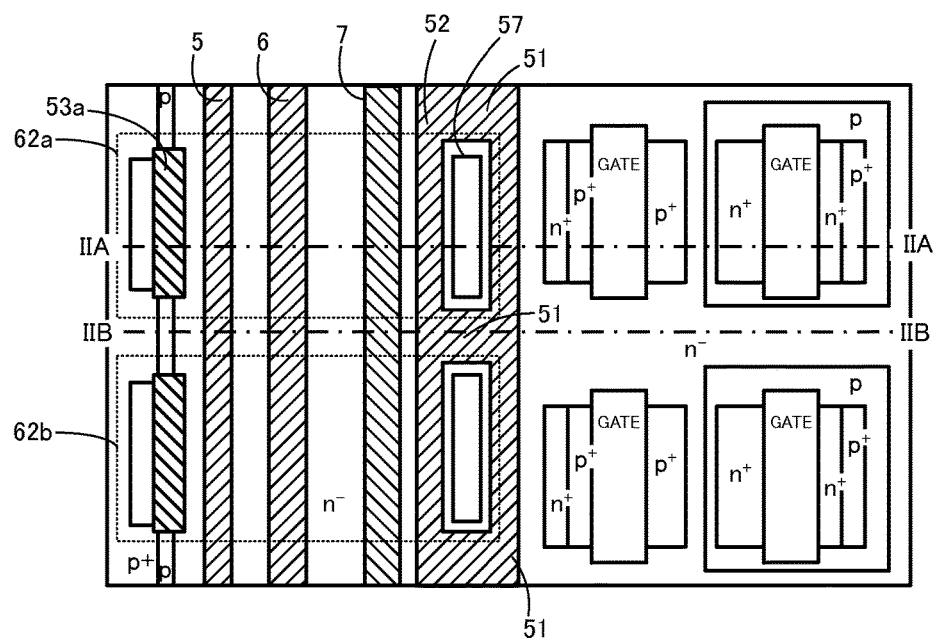

FIGS. 4A and 4B are plan views of a main part of another example of the high-voltage integrated circuit device 100 according to the first embodiment of the present invention. FIG. 4A is a general view of gate driver circuits (GDUs) and a withstand-voltage structure portion surrounding the gate driver circuits (GDUs), and FIG. 4B is an enlarged view illustrated by enlarging a region Fb illustrated in FIG. 4A. The high-voltage integrated circuit device 100 illustrated in FIGS. 4A and 4B is a modification of the high-voltage integrated circuit device 100 according to the first embodiment of the invention, and is different from the semiconductor device according to the first embodiment of the invention in terms of the following point.

Specifically, a point of FIGS. 4A and 4B different from FIGS. 2A and 2B is as follows: in FIGS. 2A and 2B, the planar shape of the high-side separation layer 51 is formed in the ring-like shape surrounding the floating potential region 34, whereas, in FIGS. 4A and 4B, the planar shape thereof is formed so as to surround the drain of the high voltage n-channel MOSFET 62.

Figure 16:
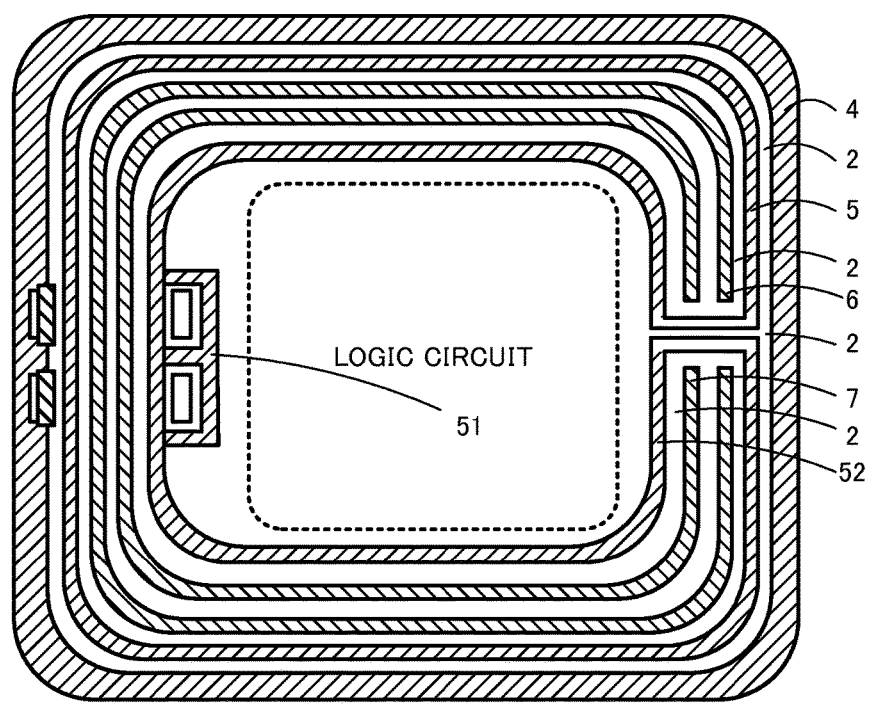
FIG. 16 is a diagram in a case in which a floating region is connected to a diode separation layer to form a bootstrap diode in a region surrounded by the floating region and the diode separation layer.

Even with such a shape, there can be obtained the same advantageous effects. In addition, as in FIG. 16, the floating region 5 may be connected to the diode separation layer 52, and the bootstrap diode Db may be formed in a region surrounded by the floating region 5 and the diode separation layer 52.

Figure 5:
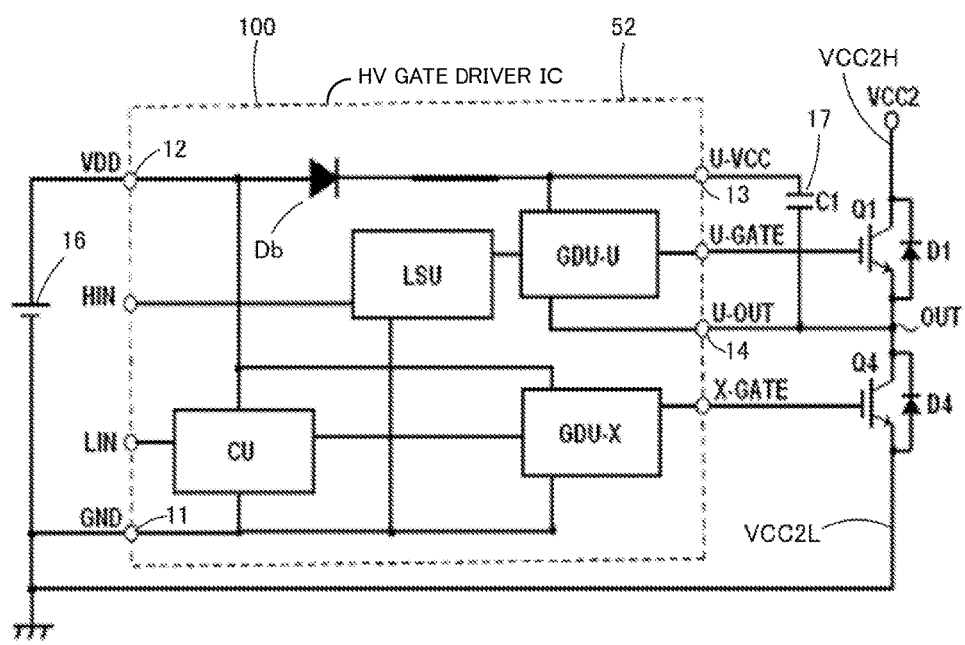
FIG. 5 is a circuit structure diagram of a case in which gate driver circuits (GDU-U and GDU-V driving upper arm IGBTs of FIG. 10) and a level shift circuit (LSU) of FIG. 11, and a bootstrap diode (Db) are integrated in one chip.

FIG. 5 is a circuit structural diagram in a case in which gate driver circuits (GDU-U and GDU-V driving the upper arm IGBTs of FIG. 10) and a level shift circuit (LSU) of FIG. 11 and a bootstrap diode (Db) are integrated into one chip. FIG. 5 illustrates an upper arm output element Q1 (U phase) and a lower arm output element Q4 (X phase) that form a main circuit, diodes D1 and D4 connected in reverse parallel to the elements, and the bootstrap capacitor C1.

In FIG. 5, a junction of the upper arm output element Q1 and the lower arm output element Q4 is a midpoint terminal OUT of the main circuit, and the junction is connected to the U-OUT terminal 14 of the high-voltage integrated circuit device 100 and also connected to a load (not illustrated), such as a motor. The U-OUT terminal 14 (an OUT terminal) is at intermediate potential and varies between the high potential-side potential VCC2H and the low potential-side potential VCC2L of the high voltage power supply VCC2 as the main circuit power supply.

A description will be given of an example of using an IGBT as each of the externally-attached upper arm output element Q1 and lower arm output element Q4. Instead of the IGBT, there may be used another output element such as a MOSFET (a MOS type field effect transistor), a GTO thyristor (a gate turn-off thyristor), a thyristor, a SIT (a static induction transistor), or a SI (a static induction) thyristor.

An upper arm diode D1 (a free-wheeling diode) is connected in reverse parallel to the upper arm output element Q1, and a lower arm diode D4 (a free-wheeling diode) is connected in reverse parallel to the lower arm output element Q4.

As illustrated in FIG. 5, the upper arm output element Q1 is driven by an upper arm driver GDU-U that is in a floating state (=a floating potential state). In other words, an output terminal U-GATE of the upper arm driver GDU-U of the HV gate driver IC is connected to a control electrode of the externally-attached upper arm output element Q1.

On the other hand, an output terminal X-GATE of a lower arm driver GDU-X of the HV gate driver IC is connected to a control electrode of the externally-attached lower arm output element Q4. The upper arm driver GDU-U is connected between the high potential-side terminal (=the U-VCC terminal 13) of a U-VCC power supply as an inner power supply and the midpoint terminal OUT (=the U-OUT terminal 14), whereby a predetermined power supply voltage (=a sum voltage of a voltage of the U-OUT terminal 14+a voltage of the VDD terminal) is supplied thereto. The upper arm driver GDU-U is a high-side circuit located in the floating potential region 34, and the lower arm driver GDU-X is a low-side circuit fixed at a low potential (ground potential).

In addition, the lower arm driver GDU-X is connected between the VDD terminal 12 as the high potential-side terminal of the VDD power supply 16 as the low voltage power supply and the GND terminal 11 at the ground potential (=ground potential), whereby a predetermined power supply voltage (=VDD potential) is supplied thereto. As illustrated in FIGS. 10 and 11, an upper arm control signal is input to the upper arm driver GDU-U from a control circuit unit CU via the high voltage n-channel MOSFET 62 in the LSU (=the level shift circuit), and a lower arm control signal is input to the lower arm driver GDU-X directly from the control circuit unit CU.

Although not illustrated in the drawing, the upper arm driver GDU-U includes an upper arm CMOS inverter, an upper arm buffer amplifier, and an upper arm control logic, whereas the lower arm driver GDU-X includes a lower arm CMOS inverter, a lower arm buffer amplifier, and a lower arm control logic.

In the structure illustrated in FIG. 5, the upper arm output element Q1 and the lower arm output element Q4 are driven by the upper arm driver GDU-U and the lower arm driver GDU-X to be each alternately turned ON/OFF.

Accordingly, the potential of the midpoint terminal (the OUT terminal) repeatedly increases and decreases between the ground potential (=GND potential=VCC2L) and the high potential-side potential VCC2H of the main power supply VCC2 according to alternate ON/OFF of the upper arm output element Q1 and the lower arm output element Q4. In the operation of the bootstrap circuit (the bootstrap diode Db and the bootstrap capacitor C1) in the alternate ON/OFF of the upper arm output element Q1 and the lower arm output element Q4, the bootstrap capacitor C1 is charged only in a period of time when the upper arm output element Q1 is OFF and the potential of the midpoint terminal OUT is reduced down to the ground potential, as described above. Thus, an ON time of a low-side switch (the lower arm output element Q4) (or an OFF time of a high-side switch (the upper arm output element Q1)) needs to be set to long enough to completely replenish charge drawn from the bootstrap capacitor C1 by the upper arm driver GDU-U.

In FIGS. 1 to 3, the bootstrap diode Db is a pn diode, and the cathode region 7 and the anode region 6 of the Db and the floating region 5 are formed in the epitaxial growth layer 2 above the cavity 3. A thickness of the semiconductor layer obtained by adding the buried layer 50 on the cavity 3 and the epitaxial growth layer 2 is, for example, 14 µm. If the cavity 3 has a thickness of 6 µm or more, the weight of the epitaxial growth layer 2 above the cavity 3 can collapse the cavity 3. Thus, the thickness of the cavity 3 is preferably 6 µm or less.

In addition, when assuming a high-voltage level shifter with a rated voltage of 1200 V class, the semiconductor substrate 1 to be used has a specific resistivity of about 250 to 400 Ωcm. The buried layer 50 positioned beneath the cavity 3 and used also as a drain drift region of the high voltage n-channel MOSFET 62 is created in such a manner that an epitaxial growth layer having an epi thickness of about 2 to 10 µm is formed on the semiconductor substrate 1 or a diffusion depth Xj becomes about 2 to 10 µm from a surface of the semiconductor substrate 1 by performing a high temperature driving process at 1100 to 1200° C.

Hereinbelow, a description will be given of a method for forming the cavity 3 of SON structure.

First, a mask oxide film is formed (thermal oxidation) on the semiconductor substrate 1 as a support substrate including the buried layer 50 formed thereon by the above method; patterning of trench holes is performed; and then trenches are etched by dry etching.

Next, after the etching, the mask oxide film is removed by wet etching, and annealing processing is performed under inert gas atmosphere (for example, hydrogen gas) at a high temperature of 1000 to 1200° C.

After the annealing, an upper part of the trench hole pattern is closed to form the cavity 3.

Herein, porous silicon may be formed by electrolytic etching or the like and annealing processing may be performed under inert gas atmosphere at high temperature to form the cavity 3. After the formation of the cavity 3, the epitaxial growth layer 2 is formed. The epitaxial growth layer 2 has an impurity concentration of about $1\times10^{14}$ to $1\times10^{16}/cm^3$.

As illustrated in FIGS. 1 and 3, in order to form each of the floating region 5 in contact with the cavity 3, the deep region 4 connected to the GND terminal 11, and the anode region 6 and the cathode region 7 of the bootstrap diode Db above the cavity 3, ion implantation of phosphorus and boron is performed by forming each mask. Amounts of doses are as follows: the dose for the anode region 6 of the bootstrap diode Db is about $1\times10^{12}$ to $1\times10^{14}/cm^2$; the dose for the cathode region 7 of the bootstrap diode Db is about $1\times10^{15}/cm^2$; the dose for the floating region 5 is about $1\times10^{12}$ to $5\times10^{14}/cm^2$; and the dose for the deep region 4 is $1\times10^{12}$ to $5\times10^{14}/cm^2$.

In order to diffuse the floating region 5 up to the cavity 3 and diffuse the deep region 4 so as to reach the semiconductor substrate 1, annealing process is performed at about 1100 to 1200° C. for about 10 hours after ion implantation. The floating region 5 allows suppression of leakage current by holes that flows from the anode region 6 of the bootstrap diode Db connected to the VDD terminal 12 to the semiconductor substrate 1 connected to the GND terminal 11. The high-side separation layer 51 and the diode separation layer 52 can also be formed by simultaneously processing together with the floating region 5.

Herein, the anode region 6 and the cathode region 7 of the bootstrap diode Db may be diffused down to the cavity 3. However, a gap is provided between the anode region 6 of the bootstrap diode Db, the floating region 5, and the deep region 4 so that these regions are not connected to each other. The cap between the anode region 6 and the cathode region 7 of the bootstrap diode Db is set to about 100 µm, and the gap between the anode region 6 and the floating region 5 is set to be a gap that is not punched through with a voltage (for example, about 15 V) of the VDD power supply 16.

Additionally, the high voltage n-channel MOSFET 62 includes the source region 55 formed on a surface of the deep region 4, a gate electrode 53a arranged above the deep region 4 via the gate oxide film 37, and the drain contact region 57. In addition, the drain drift region of the high voltage n-channel MOSFET 62 includes the epitaxial growth layer 2 between the floating region 5 and the deep region 4, the epitaxial growth layer 2 surrounded by the high-side separation layer 51 and the diode separation layer 52, and the buried layer 50.

By setting so that the buried layer 50 beneath the cavity 3 has an effective depth of 1 µm or more, the buried layer 50 can be used as the drain drift region to allow the high voltage n-channel MOSFET 62 as a level shift device to transmit a sufficient signal to the high-side CMOS circuit 33 (the logic circuit).

Although not illustrated in FIG. 1, LOCOS as a field oxide film is formed between the diffusion regions on the surface of the epitaxial growth layer 2. In addition, there are provided an interlayer insulating film as a silicon oxide film made of TEOS (tetraethoxy silane), BPSG (boron phosphorus glass), or the like and a passivation film as a silicon nitride film.

Herein, after the formation of the cavity 3, not a n⁻-type epitaxial growth layer 2 but a p⁻-type epitaxial growth layer may be grown, and then a phosphorus impurity may be injected to form the epitaxial growth layer 2 between the deep region 4 and the floating region 5 that become GNDp regions of FIG. 1, the epitaxial growth layer 2 between the floating region 5 and the cathode region 7, and the epitaxial growth layer 2 surrounded by the high-side separation layer 51 and the diode separation layer 52. After the impurity implantation, annealing processing is performed at 1100 to 1200° C. for about 10 hours to diffuse these n regions down to the depth of the cavity. In this case, these n regions have a concentration of about $1\times10^{14}$ to $1\times10^{17}/cm^3$. In this case, the deep region 4, the floating region 5, the high-side separation region 51, and the diode separation layer 52 of FIG. 1 are replaced by a p⁻-type epitaxial growth layer.

As described hereinabove, in the high-voltage integrated circuit device 100 according to the first embodiment of the invention, providing the floating region 5 allows suppression of leakage current by the holes to the semiconductor substrate 1 when charging the externally-attached bootstrap capacitor C1, so that the high-voltage integrated circuit device 100 having the gate driver circuits with small power consumption and high function can be achieved. Additionally, locating the bootstrap diode Db and the high voltage n-channel MOSFET 62 in the upper and lower directions of the cavity 3 can reduce an area for the HV gate driver IC, as well as there can be formed a bootstrap circuit that does not cause mutual influence between these devices and hardly malfunctions. In addition, the cavity 3 may be partially formed in an island region (a belt-shaped ring region) of the bootstrap diode Db, so that there is little influence of the cavity 3 on warping of a wafer (the p⁻-type semiconductor substrate 1).

In the above-described structure, there has been described the case in which the insulating separation region is the cavity 3 of SON structure. However, it may be an insulating film of SOI structure. In this case, an insulating film of partial SOI structure that becomes an insulating separation region may be formed on the buried layer 50 of the semiconductor substrate 1, and the epitaxial growth layer 2 may be formed on the insulating film. In this case, the insulating film of SOI structure as the insulating separation region is formed in the buried layer 50 and an n-type semiconductor layer including the epitaxial growth layer 2.

When a partial SOI semiconductor substrate using an oxide film is used instead of a partial SON semiconductor substrate using the cavity 3, the oxide film needs to have a thickness of about 15 µm (calculated by assuming that the relative permittivity of the oxide film is 3.9) at a breakdown voltage of about 1500 V. Thus, since the thickness of the oxide film needs to be 4 times thicker than the cavity 3, production cost increases. Nevertheless, insulation effect is obtained, so that an oxide film may be usable instead of the cavity 3.

In addition, the cavity 3 can be formed merely by adding a trench hole formation step (mask oxidation, patterning, and trench etching) and a hydrogen annealing step, so that production cost can be reduced as compared to the use of an SOI substrate using an oxide film.

Next will be a description of the thickness of the cavity 3 described above. In the high-voltage integrated circuit device 100, when reversal bias is applied to each of the bootstrap diode Db and the high voltage n-channel MOSFET 62, the buried layer 50 is completely depleted. Then, a breakdown voltage Vbr of a dielectric separation type high-voltage integrated circuit device that does not impair the RESURF effect is expressed by formula (1) converted from the Poisson equation.

$$\text{Vbr}=\text{Ecr}\times(d/2+\text{Tox}\times\varepsilon\text{si}/\varepsilon\text{ox}) \quad (1)$$

Here, Ecr represents critical electric field; d represents thickness of n⁻-type semiconductor layer; Tox represents thickness of dielectric layer; εsi represents relative permittivity of silicon; and εox represents relative permittivity of dielectric.

When the dielectric layer is the cavity 3, a relative permittivity $\varepsilon_{cavity}$ of the cavity 3 corresponding to εox is 1, Ecr is $3\times10^5$ (V/cm), d is 10 µm, and εsi is 11.7. When $T_{cavity}$=4 µm as a thickness of the cavity 3 corresponding to Tox is substituted, Vbr will be 1550 V. The thickness of the cavity 3 becomes about ¼ of the thickness of an oxide film when an SOI substrate is used.

Typically, the level shifter LSU and the bootstrap diode Db incorporated in the high-voltage integrated circuit device 100 are required to have a breakdown voltage of about 1500 V at minimum at a rated voltage of 1200 V, when considering specific resistance variation of the n⁻ semiconductor layer (the epitaxial growth layer 2), thickness variation of the cavity 3, actual breakdown voltages of the power transistors Q1 and Q4 as the externally attached components, and the like. From the above formula (1), it can be seen that the breakdown voltage of the dielectric separation type high-voltage integrated circuit device can be raised merely by increasing the film thickness of the n⁻ semiconductor layer (the epitaxial growth layer 2) or the dielectric layer. However, when the dielectric layer is the cavity 3, if the cavity 3 is formed to be thick, the cavity 3 is collapsed by the weight of the semiconductor layer above the cavity 3. Thus, the thickness of the cavity 3 is suitably about 4 to 6 µm.

Figure 6A:
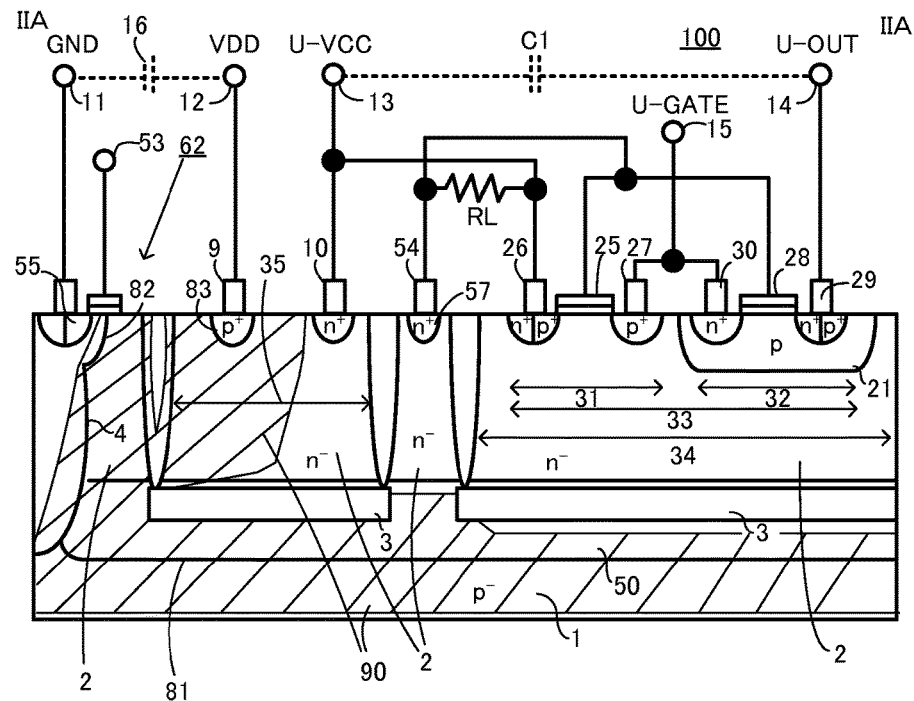
Figure 6B:
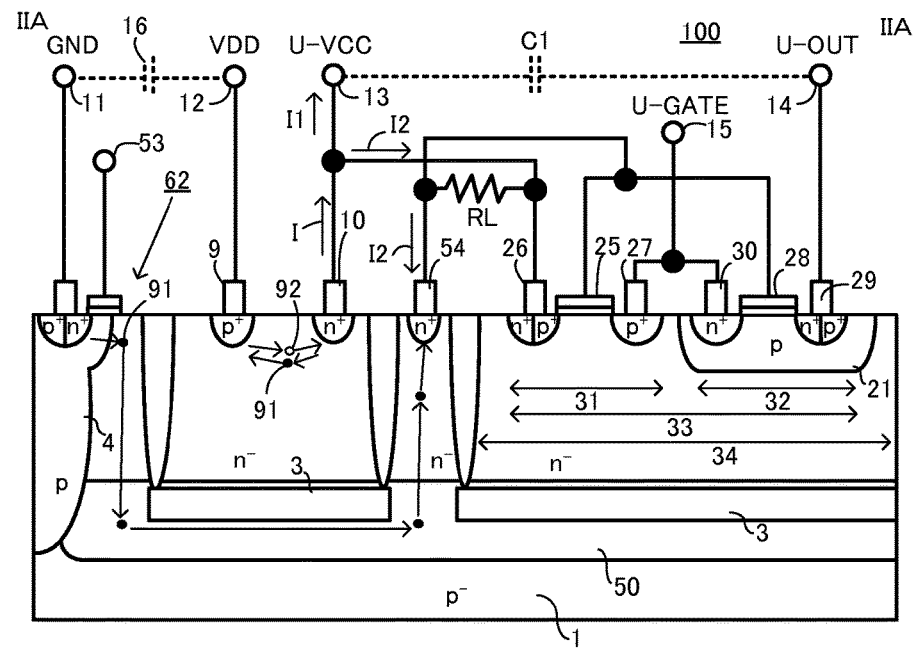

FIGS. 6A and 6B are diagrams illustrating a depletion layer 90 generated when high voltage is applied to the cathode region 7 and the drain contact region 57 and the flows of carriers (electrons 91 and holes 92) when the high voltage n-channel MOSFET 62 and the bootstrap diode Db are turned ON, in which FIG. 6A is a diagram of the depletion layer, and FIG. 6B is a diagram illustrating the flows of the carriers.

In FIGS. 6A and 6B, when the high voltage n-channel MOSFET 62 is in an OFF state, a potential of the U-VCC terminal 13 is a potential obtained by adding a potential of the VDD terminal 12 to a potential of the U-OUT terminal 14.

In FIG. 6A, when the potential of the U-OUT terminal 14 becomes the high potential-side potential VCC2H of the main power supply VCC2 and the high voltage n-channel MOSFET 62 is OFF, high voltage is applied to the cathode region 7 of the bootstrap diode Db and the drain contact region 57 of the high voltage n-channel MOSFET 62. Then, depletion layers 90 extending from pn junctions 81, 82, are connected in the buried layer 50 to reach the cavity 3. In addition, the depletion layer 90 extending from a pn junction 83 also partially reaches the cavity. In this state, an ON signal is applied to the gate of the U-phase upper arm output element Q1 via the GDU to turn ON the Q1.

On the other hand, when the high voltage n-channel MOSFET 62 is turned ON, electrons (not illustrated), equivalent to electrons 91 illustrated in FIG. 6B, flow from the source region 55 to the drain contact region 57 to discharge the bootstrap capacitor C1. Thereby, the voltage of the bootstrap capacitor C1 decreases. The potential of the drain contact region 57 becomes a ground potential and the widths of the depletion layers 90 extending from the pn junctions 81, 82 become narrow. However, the depletion layer 90 extending from the pn junction 83 is maintained as it is.

In FIG. 6B, when the X-phase lower arm output element Q4 of the main circuit is turned ON, the potential of the U-OUT terminal 14 becomes a ground potential, and the potential of the U-VCC terminal 13 becomes lower than the potential of the VDD terminal 12, the bootstrap diode Db is forward biased. At this time, the high voltage n-channel MOSFET 62 is ON and the Q1 is in an OFF state. The forward bias allows the holes 92 to flow from the anode region 6 to the cathode region 7 and allows the electrons 91 to flow from the cathode region 7 to the anode region 6. Conductivity modulation occurs in the epitaxial growth layer 2 as the drift region, and a current I flows in a low ON-voltage state. The current I is divided into a current I1 that charges the bootstrap capacitor C1 and a current I2 that flows to the drain contact region 57 since the high voltage n-channel MOSFET 62 is ON. The current I2 is small since it flows via the level shift resistor RL, and most of the current I flows as the current I1. Making the amount of the current I1 large allows quick charging of the bootstrap capacitor C1 whose voltage has been reduced due to discharging. Providing the floating region 5, the cavity 3, and the diode separation layer 52 allows the prevention of the holes 92 injected from the anode region 6 from leaking to the semiconductor substrate 1. As a result, leakage current to the semiconductor substrate 1 can be suppressed.

By locating the buried layer 50 as the drift region of the high voltage n-channel MOSFET 62 beneath a formation region 35 of the bootstrap diode Db, apart of an area occupied by the high voltage n-channel MOSFET 62 can be allocated to the bootstrap diode Db, so that the area of the bootstrap diode Db can be increased. As a result, the large current I1 can be flown through the bootstrap diode Db, whereby the bootstrap capacitor C1 can be quickly charged, as mentioned above. This allows achievement of a high frequency inverter device.

In the first embodiment, the cavity 3 of SON structure is formed as the insulating separation region in the buried layer 50 of the semiconductor substrate 1; the epitaxial growth layer 2 above the cavity 3 is used as the drift region of the bootstrap diode Db; and the buried layer 50 beneath the cavity 3 is used as the drain drift region of the high voltage n-channel MOSFET 62 as the level shift device.

The bootstrap diode Db and the high voltage n-channel MOSFET 62 each are element-isolated by the cavity 3 and the p-type diffusion layers (the p-type floating region 5 and the p-type diode separation layer 52), whereby leakage current by the holes to the semiconductor substrate 1 in charging the bootstrap capacitor C1 can be suppressed.

In addition, since the entire high-voltage junction terminating region can be used as the bootstrap diode Db, charging current can also be maximally utilized.

Furthermore, since the high voltage n-channel MOSFET 62 is located beneath the bootstrap diode Db, it is unnecessary to locate the high voltage n-channel MOSFET 62 also in another region, thus allowing suppression of increase in chip area.

Second Embodiment

Figure 7:
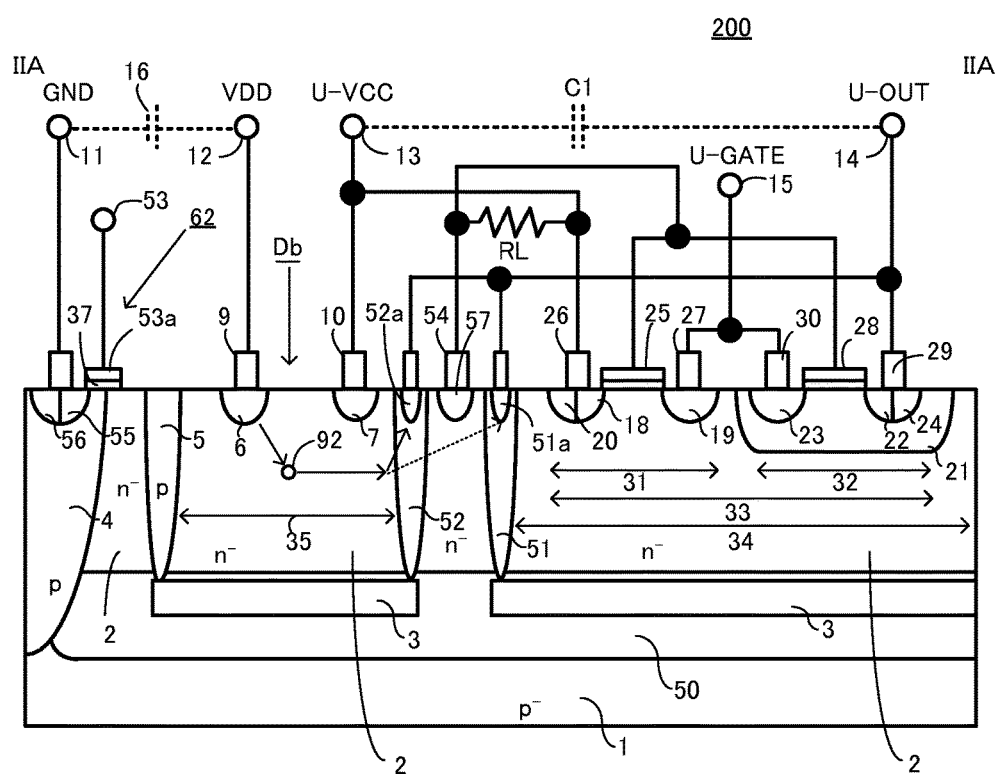
FIG. 7 is a sectional view of a main part of a high-voltage integrated circuit device according to a second embodiment of the present invention (a sectional view illustrating a sectional structure in a position corresponding to the line IIA-IIA of FIG. 2B)

As illustrated in FIG. 7, a high-voltage integrated circuit device 200 according to a second embodiment of the present invention is different from the high-voltage integrated circuit device 100 according to the first embodiment of the invention in terms of the following structure.

Specifically, in the high-voltage integrated circuit device 100 according to the first embodiment of the invention, the p-type high-side separation layer 51 and the p-type diode separation layer 52 are in the floating state. In contrast, in the high-voltage integrated circuit device 200 according to the second embodiment of the invention, a p$^+$-type contact region 51a is formed at an upper part of the p-type high-side separation layer 51, and a p$^+$-type contact region 52a is formed at an upper part of the p-type diode separation layer 52, respectively. The U-OUT terminal 14 is connected to the contact regions 51a and 52a. This structure allows the suppression of malfunction of the CMOS circuit 33 when a negative voltage surge is applied to the U-OUT terminal 14.

Here, when the upper arm output element Q1 is turned OFF from ON, an induced electromotive force of load causes a negative voltage surge. Thereby, the negative voltage surge is applied to the U-OUT terminal 14. Then, as illustrated in FIG. 1, the holes 92 are injected into the high-side drive circuit (the CMOS circuit 33) from the anode region 6 of the bootstrap diode Db via the p-type high-side separation layer 51 and the p-type diode separation layer 52, whereby the CMOS circuit 33 may malfunction.

In order to prevent the phenomenon, the p$^+$-type contact region 51a is formed at the upper part of the p-type high-side separation layer 51 and the p$^+$-type contact region 52a is formed at the upper part of the p-type diode separation layer 52. Connecting these contact regions 51a and 52a to the U-OUT terminal 14 allows the holes 92 that have entered the p-type high-side separation layer 51 and the p-type diode separation layer 52, as illustrated in FIG. 7, to be drawn out from the U-OUT terminal 14 that is at a lower potential than the ground potential.

As a result, there can be achieved a high-voltage integrated circuit device 200 including an HV gate driver IC that is highly resistant against negative voltage surge. Obviously, the advantageous effects described in the first embodiment can similarly be obtained. When the upper parts of the high-side separation layer 51 and the diode separation layer 52 have a sufficiently high impurity concentration and are in ohmic contact with an external wire, regions having a high impurity concentration in the respective upper parts of the high-side separation layer 51 and the diode separation layer 52 become the contact regions 51a and 52a.

In addition, in the high-voltage integrated circuit device 100 according to the first embodiment described above, the p-type base region 4a is formed at the upper part of the p-type deep region 4, as illustrated in FIG. 1. In contrast, in the high-voltage integrated circuit device 200 according to the second embodiment of the invention, as illustrated in FIG. 7, the p-type base region 4a is not formed, and the n$^+$-type source region 55 is formed at the upper part of the deep region 4. Accordingly, there may be cases where the p-type base region 4a is not formed. However, separately forming the base region 4a and the deep region 4 makes it easier to control the impurity concentration of the backgate of the high voltage n-channel MOSFET 62.

Third Embodiment

Figure 8:
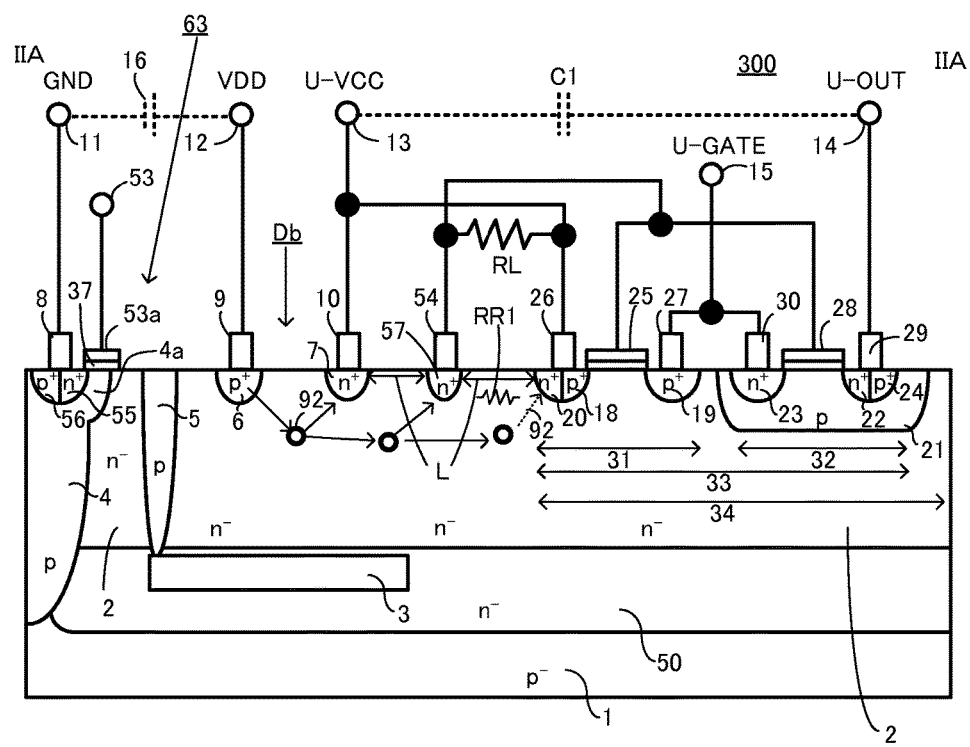
FIG. 8 is a sectional view of a main part of a high-voltage integrated circuit device according to a third embodiment of the present invention (a sectional view illustrating a sectional structure in the position corresponding to the line IIA-IIA of FIG. 2B)

As illustrated in FIG. 8, a high-voltage integrated circuit device 300 according to a third embodiment of the present invention is different from the high-voltage integrated circuit device 100 according to the first embodiment of the invention described above in terms of the following structure.

Specifically, as illustrated in FIG. 1, in the high-voltage integrated circuit device 100 according to the first embodiment of the invention, the n$^+$-type drain contact region 57 of the high voltage n-channel MOSFET 62 is provided in the epitaxial growth layer 2 between the high-side separation layer 51 and the diode separation layer 52, and the cavity 3 is located beneath the high-side separation layer 51 and the floating potential region 34.

In contrast, in the high-voltage integrated circuit device 300 according to the third embodiment of the invention, as illustrated in FIG. 8, the high-side separation layer 51 and the diode separation layer 52 are not provided. Thus, the structure of a high voltage n-channel MOSFET 63 is different from that of the high voltage n-channel MOSFET 62 of the first embodiment. Additionally, in the high-voltage integrated circuit device 300 according to the third embodiment of the invention, the cavity 3 is not provided beneath the floating potential region 34.

Additionally, in the high-voltage integrated circuit device 300 according to the third embodiment of the invention, a distance L between the drain contact region 57 and each of the cathode region 7 of the bootstrap diode Db and the n$^+$-type contact region 20 of the p-channel MOSFET 31 is sufficiently extended. With the sufficiently extended distance L, the holes 92 injected from the anode region 6 of the bootstrap diode Db when negative surge is applied to the U-OUT terminal 14 are drawn out from the cathode region 7 and the drain contact region 57, thereby suppressing injection of the holes 92 into the floating potential region 34. This structure is simpler than that of the first embodiment, and while the occupied area becomes larger, the structure is simplified, so that yield can be improved. In addition, in order to suppress malfunction of the level shift circuit, a resistance value of a parasitic resistance RR1 between the drain contact region 57 and the n$^+$-type contact region 20 needs to be set larger than a resistance value of the level shift resistor RL.

The distance between the drain contact region 57 and the n$^+$-type contact region 20 is preferably 100 μm or more, considering the above-mentioned resistance condition. In addition, in order to shorten the distance between the drain contact region 57 and the contact region 20, a p-type diffusion layer may be located in an upper part of the epitaxial growth layer 2 to raise the resistance value of the parasitic resistance RR1.

In FIG. 8, the distance L is set to be larger than a diffusion length of the holes 92 that are injected from the anode region 6 in order not to allow the holes 92 injected from the anode region 6 to enter the cathode region 7 and the drain contact region 57 and then enter the contact region 20 and the p$^+$-type source region 18 on the high-side. In this manner, by setting the distance L to be larger than the diffusion length of the holes 92, the holes 92 as indicated by a dotted line disappear due to recombination, before reaching the contact region 20 and the p$^+$-type source region 18. The diffusion length of the holes 92 is about several 10 μm.

Fourth Embodiment

Figure 9:
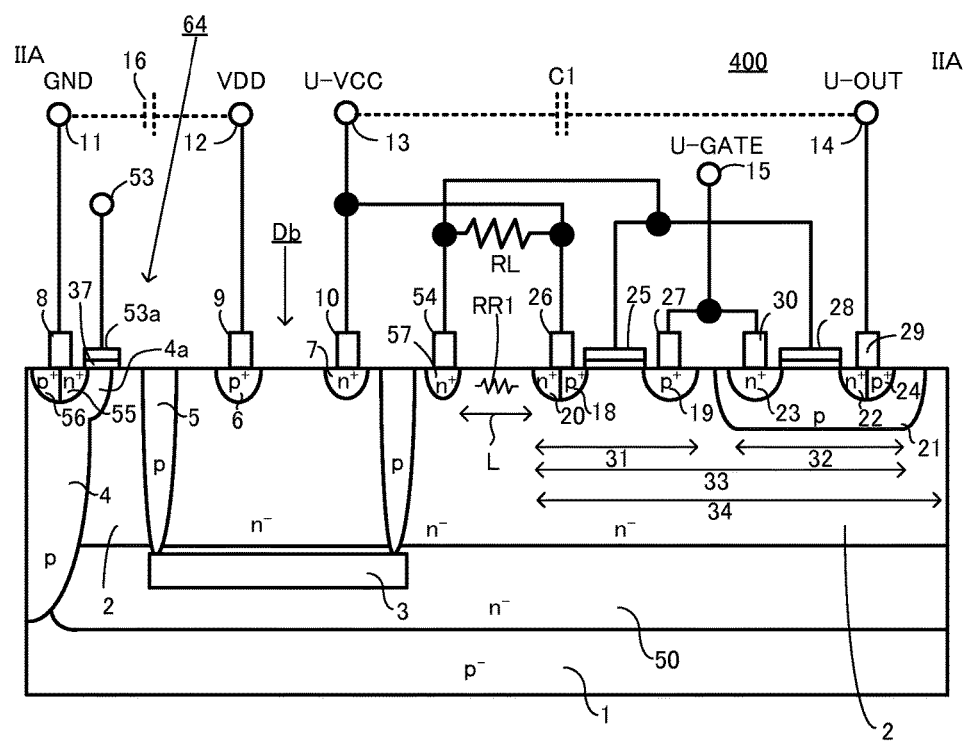
FIG. 9 is a sectional view of a main part of a high-voltage integrated circuit device according to a fourth embodiment of the present invention (a sectional view illustrating a sectional structure in the position corresponding to the line IIA-IIA of FIG. 2B)

As illustrated in FIG. 9, a high-voltage integrated circuit device 400 according to the fourth embodiment of the present invention is different from the high-voltage integrated circuit device 100 of the first embodiment described above in terms of the following structure.

Specifically, as illustrated in FIG. 1, the high-voltage integrated circuit device 100 of the first embodiment 100 has the structure in which the high-side separation layer 51 is provided between the drain contact region 57 of the high voltage n-channel MOSFET 62 and the floating potential region 34, and the cavity 3 is located beneath the high-side separation layer 51 and the floating potential region 34.

In contrast, in the high-voltage integrated circuit device 400 according to the fourth embodiment of the invention, as illustrated in FIG. 9, the high-side separation layer 51 is not provided, and the cavity 3 is also not provided beneath the floating potential region 34.

In addition, in the high-voltage integrated circuit device 400 according to the fourth embodiment of the present invention, the distance L between the drain contact region 57 and the contact region 20 is sufficiently extended. In this manner, sufficiently extending the distance L allows the suppression of malfunction of the level shift circuit. As with the third embodiment, the resistance value of the parasitic resistance RR1 between the drain contact region 57 and the contact region 20 needs to be larger than the resistance value of the level shift resistor RL.

The distance between the drain contact region 57 and the contact region 20 is preferably 100 μm or more, considering the above-mentioned resistance condition. In addition, in order to shorten the distance between the drain contact region 57 and the contact region 20, a p-type diffusion layer may be located in an upper part of the epitaxial growth layer 2 to raise the resistance value of the parasitic resistance RR1.

While the invention accomplished by the present inventor has been described in detail on the basis of the above-described embodiments, the invention is not limited to the above embodiments and, obviously, can be modified in various forms without departing from the scope of the invention.

The semiconductor devices according to the first to the fourth embodiments of the present invention have been described with reference to the case of using the silicon semiconductor substrate as a semiconductor substrate. However, the invention is not limited thereto and applicable to semiconductor devices using, for example, a semiconductor substrate made of silicon carbide (SiC), gallium nitride (GaN), or the like.

INDUSTRIAL APPLICABILITY

As described hereinabove, the semiconductor device according to the present invention can suppress leakage current by the holes that flows to a substrate side in forward biasing of the bootstrap diode, and can increase charging current for the bootstrap capacitor, as well as can suppress increase in chip area. Accordingly, the invention is useful for semiconductor devices including a high voltage MOSFET and a bootstrap diode on the same substrate.

REFERENCE SIGNS LIST

1: Semiconductor substrate
2: Epitaxial growth layer (semiconductor layer)
3: Cavity (first insulating separation region, second insulating separation region)
4: Deep region (first separation region)
5: Floating region (second separation region)
6: Anode region
7: Cathode region
8: GND electrode
9: Anode electrode
10: Cathode electrode
11: GND terminal
12: VDD terminal
13: U-VCC terminal
14: U-OUT terminal
15: U-GATE terminal
16: VDD power supply
18: Source region
19: Drain region
20: Contact region
21: Offset region
22: Source region
23: Drain region
24, 56: Contact region
25, 28, 53a: Gate electrode
26, 29: Source electrode
27, 30, 54a: Drain electrode
31: p-channel MOSFET
32: n-channel MOSFET
33: CMOS circuit
34: Floating potential region
35: Formation region
50: Buried layer
51: High-side separation layer (fourth separation region)
51a, 52a: Contact region 52: Diode separation layer (third separation region)
53: Gate terminal
54: Drain terminal
55: Source region
56: Contact region
57: Drain contact region
62, 63: High voltage n-channel MOSFET
81, 82, 83: pn junction
90: Depletion layer
91: Electron
92: Hole
100, 200, 300, 400: High-voltage integrated circuit device
Db: Bootstrap diode
C1: Bootstrap capacitor
RL: Level shift resistor
Q1 to Q3: Upper arm output element
Q4 to Q6: Lower arm output element
VCC2: Main power supply
VCC2H: High potential-side potential
VCC2L: Low potential-side potential
L: Distance
GDU: Gate driver circuit

The invention claimed is:

1. A semiconductor device comprising:
 a p-type semiconductor substrate;
 an n-type buried layer formed on the semiconductor substrate;
 an n-type semiconductor layer formed on the buried layer;
 a floating potential region provided in a part of the semiconductor layer;
 a p-type first separation region surrounding the part of the semiconductor layer where the floating potential region is provided, the first separation region being in contact with the semiconductor substrate, and spaced apart from the floating potential region to be formed in an annular shape;
 a first insulating separation region provided beneath the semiconductor layer between the floating potential region and the first separation region;
 a diode formed above the first insulating separation region;
 a p-type second separation region spaced apart from the first separation region to surround, in an annular shape, a region where the diode is located, and reach beneath the semiconductor layer from a surface of the semiconductor layer;
 an n-type source region formed in an upper part of the first separation region;
 an n-type drain contact region of a transistor including the source region, the drain contact region being formed in an upper part of the semiconductor layer between a cathode region of the diode and the floating potential region; and
 a drain drift region of the transistor comprising the n-type buried layer beneath the first insulating separation region.

2. The semiconductor device according to claim 1, wherein the diode includes:
 a p-type anode region spaced apart from the second separation region and formed in another upper part of the semiconductor layer above the first insulating separation region; and
 the cathode region of n-type spaced apart from the anode region and the floating potential region between the anode region and the floating potential region and formed in the another upper part of the semiconductor layer above the first insulating separation region.

3. The semiconductor device according to claim 2, wherein the transistor further includes a gate electrode formed, via a gate insulating film, above the first separation region located between the source region and the drain contact region.

4. The semiconductor device according to claim 3, wherein a logic circuit is integrated on the floating potential region.

5. The semiconductor device according to claim 4, further comprising
 a p-type third separation region that reaches the first insulating separation region from the surface of the semiconductor layer between the cathode region and the drain contact region.

6. The semiconductor device according to claim 5, further comprising
 a second insulating separation region provided beneath the semiconductor layer so as to cover an area below the logic circuit and a p-type fourth separation region that reaches the second insulating separation region from the surface of the semiconductor layer between the drain contact region and the floating potential region.

7. The semiconductor device according to claim 5, wherein the third separation region is electrically connected to a low potential-side of a power supply of the logic circuit.

8. The semiconductor device according to claim 6, wherein the fourth separation region is electrically connected to a low potential-side of a power supply of the logic circuit.

9. The semiconductor device according to claim 6, wherein the second separation region, the third separation region, the fourth separation region, the anode region, and the cathode region have closed annular planar shapes.

10. The semiconductor device according to claim 6, wherein the second insulating separation region is a cavity.

11. The semiconductor device according to claim 1, wherein a distance between the drain contact region and another contact region in the floating potential region is longer than a diffusion length of holes that are injected from an anode region of the diode.

12. The semiconductor device according to claim 1, wherein the first insulating separation region is a cavity.

13. The semiconductor device according to claim 1, comprising a conduction path that connects the cathode region and the floating potential region.

14. The semiconductor device according to claim 1, wherein the buried layer comprises a diffusion layer formed in an upper part of the semiconductor substrate, and the semiconductor layer comprises an epitaxial growth layer formed on the buried layer.

15. The semiconductor device according to claim 1, wherein the buried layer comprises a first epitaxial growth layer formed on the semiconductor substrate, and the semiconductor layer comprises a second epitaxial growth layer formed on the first epitaxial growth layer.

16. A semiconductor device comprising:
 a p-type semiconductor substrate;
 an n-type buried layer formed on the semiconductor substrate;
 an n-type semiconductor layer formed on the buried layer;
 a floating potential region provided in a part of the semiconductor layer;
 a p-type first separation region surrounding the part of the semiconductor layer where the floating potential region is provided, the first separation region being in contact with the semiconductor substrate, and spaced apart from the floating potential region to be formed in an annular shape;
a first insulating separation region provided beneath the semiconductor layer between the floating potential region and the first separation region;
a diode formed above the first insulating separation region;
a p-type second separation region spaced apart from the first separation region to surround, in an annular shape, a region where the diode is located, and reach beneath the semiconductor layer from a surface of the semiconductor layer;
a p-type base region formed in another upper part of the semiconductor layer between the first separation region and the second separation region;
an n-type source region formed on an upper part of the base region;
an n-type drain contact region of a transistor including the base region and the source region, the drain contact region being formed in an upper part of the semiconductor layer between a cathode region of the diode and the floating potential region; and
a drain drift region of the transistor comprising the n-type buried layer beneath the first insulating separation region.

17. A semiconductor device comprising:
a p-type semiconductor substrate;
an n-type buried layer formed on the semiconductor substrate;
a floating potential region provided on the buried layer, a logic circuit being formed in the floating potential region;
an n-type semiconductor layer having the same thickness as the floating potential region and located in an island shape on the buried layer so as to surround the floating potential region;
a p-type first separation region provided in an annular shape so as to surround the semiconductor layer and spaced apart from the floating potential region to reach the semiconductor substrate from an upper surface of the semiconductor layer;
a first insulating separation region provided in the buried layer between the floating potential region and the first separation region;
a diode formed above the first insulating separation region;
a p-type second separation region spaced apart from the first separation region, formed in an annular shape so as to surround a part of the semiconductor layer where the diode is located, and passing through the semiconductor layer;
an n-type source region of a transistor, the source region being provided on an upper part of the first separation region;
an n-type drain contact region of the transistor, the drain contact region being provided in an upper part of the semiconductor layer between a cathode region of the diode and the floating potential region; and
a drain drift region of the transistor comprising the n-type buried layer beneath the first insulating separation region.

18. The semiconductor device according to claim 17, wherein the diode includes:
a p-type anode region formed in the semiconductor layer above the first insulating separation region; and
the cathode region of n-type formed in the semiconductor layer between the anode region and the floating potential region.

19. The semiconductor device according to claim 17, wherein the transistor uses, as a base region, a part of the upper part of the first separation region located between the source region and the drain contact region, wherein the transistor further includes a gate electrode formed above the base region via a gate insulating film.

20. A semiconductor device comprising:
a p-type semiconductor substrate;
an n-type buried layer formed on the semiconductor substrate;
a floating potential region provided on the buried layer, a logic circuit being formed in the floating potential region;
an n-type semiconductor layer having the same thickness as the floating potential region and located in an island shape on the buried layer so as to surround the floating potential region;
a p-type first separation region provided in an annular shape so as to surround the semiconductor layer and spaced apart from the floating potential region to reach the semiconductor substrate from an upper surface of the semiconductor layer;
a first insulating separation region provided in the buried layer between the floating potential region and the first separation region;
a diode formed above the first insulating separation region;
a p-type second separation region spaced apart from the first separation region, formed in an annular shape so as to surround a part of the semiconductor layer where the diode is located, and passing through the semiconductor layer;
a p-type base region of a transistor, the base region being formed in an upper part of the semiconductor layer between the first separation region and the second separation region;
an n-type source region of the transistor, the source region being formed on an upper part of the base region;
an n-type drain contact region of the transistor, the drain contact region being provided in another upper part of the semiconductor layer between a cathode region of the diode and the floating potential region; and
a drain drift region of the transistor comprising the n-type buried layer beneath the first insulating separation region.

* * * * *

UNITED STATES PATENT AND TRADEMARK OFFICE
CERTIFICATE OF CORRECTION

PATENT NO. : 10,002,961 B2
APPLICATION NO. : 14/781244
DATED : June 19, 2018
INVENTOR(S) : Masaharu Yamaji It is certified that error appears in the above-identified patent and that said Letters Patent is hereby corrected as shown below:

In the Claims

Column 23, Line 14:
In Claim 16, delete "another" and insert -- an --, therefore.

Column 23, Line 22:
In Claim 16, delete "an" and insert -- another --, therefore.

Signed and Sealed this
Thirteenth Day of November, 2018

Andrei Iancu
*Director of the United States Patent and Trademark Office*